(12) United States Patent
Fang et al.

(10) Patent No.: US 11,211,319 B2
(45) Date of Patent: Dec. 28, 2021

(54) DEVICE STRUCTURE

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW); Chen Yuan Weng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 7 days.

(21) Appl. No.: 16/691,296

(22) Filed: Nov. 21, 2019

(65) Prior Publication Data

US 2021/0159156 A1    May 27, 2021

(51) Int. Cl.
*H01L 23/498* (2006.01)
*H01L 23/528* (2006.01)
*H01L 23/544* (2006.01)

(52) U.S. Cl.
CPC .... *H01L 23/49838* (2013.01); *H01L 23/5283* (2013.01); *H01L 23/544* (2013.01)

(58) Field of Classification Search
CPC .......... H01L 23/49838; H01L 23/5283; H01L 23/544
See application file for complete search history.

(56) References Cited

U.S. PATENT DOCUMENTS

| | | | |
|---|---|---|---|
| 6,593,168 B1 * | 7/2003 | Ehrichs | H01L 23/544 257/797 |
| 6,938,335 B2 * | 9/2005 | Kuribayashi | H05K 13/0815 29/834 |
| 8,062,098 B2 * | 11/2011 | Duescher | B24D 18/00 451/259 |
| 10,050,003 B2 * | 8/2018 | DeLaCruz | H01L 24/17 |
| 2002/0119600 A1 | 8/2002 | Pierce | |
| 2008/0185735 A1 * | 8/2008 | Pham | H05K 1/111 257/778 |

* cited by examiner

*Primary Examiner* — Nicholas J Tobergte
(74) *Attorney, Agent, or Firm* — Foley & Lardner LLP

(57) ABSTRACT

A device structure includes a first electronic structure and a plurality of first electric contacts. The first electronic structure has a surface and a center. The first electric contacts are exposed from the surface. The first electric contacts are spaced by a pitch that increases with increasing distance from the center.

19 Claims, 31 Drawing Sheets

DEVICE STRUCTURE

BACKGROUND

1. Field of the Disclosure

The present disclosure relates to a device structure, and to a device structure including a plurality of electric contacts.

2. Description of the Related Art

In the chip last process, a semiconductor die may be electrically connected to a plurality of pads of a redistribution layer (RDL) through a plurality of copper-pillar bumps. Since the coefficient of thermal expansion (CTE) of the redistribution layer is greater than the CTE of the semiconductor die, the peripheral pads of the RDL may generate a large outward displacement relative to the central pads due to thermal expansion in a solder reflow process, thereby causing a misalignment between the pads of the RDL and the copper-pillar bumps. Said misalignment may cause the cu-pillar bumps to crack during a reliability test. In a worst case, some of the copper-pillar bumps of the semiconductor die may be not bonded to the predetermined pads of the RDL.

SUMMARY

In some embodiments, a device structure includes a first electronic structure and a plurality of first electric contacts. The first electronic structure has a surface and a center. The first electric contacts are exposed from the surface. The first electric contacts are spaced by a pitch that increases with increasing distance from the center.

In some embodiments, a device structure includes a first electronic structure and a plurality of first electric contacts. The first electronic structure has a surface and a center. The first electric contacts are exposed from the surface. Each of the first electric contacts has a maximum length along a long axis thereof. The long axis extends through the center. The maximum length increases with increasing distance from the center.

In some embodiments, a device structure includes a first electronic structure, a plurality of first electric contacts and at least one alignment mark. The first electronic structure has a surface and a center. The first electric contacts are exposed from the surface. The alignment mark is disposed adjacent to at least one of the first electric contacts. The alignment mark is disposed at an axis extending through the center of the first electronic structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
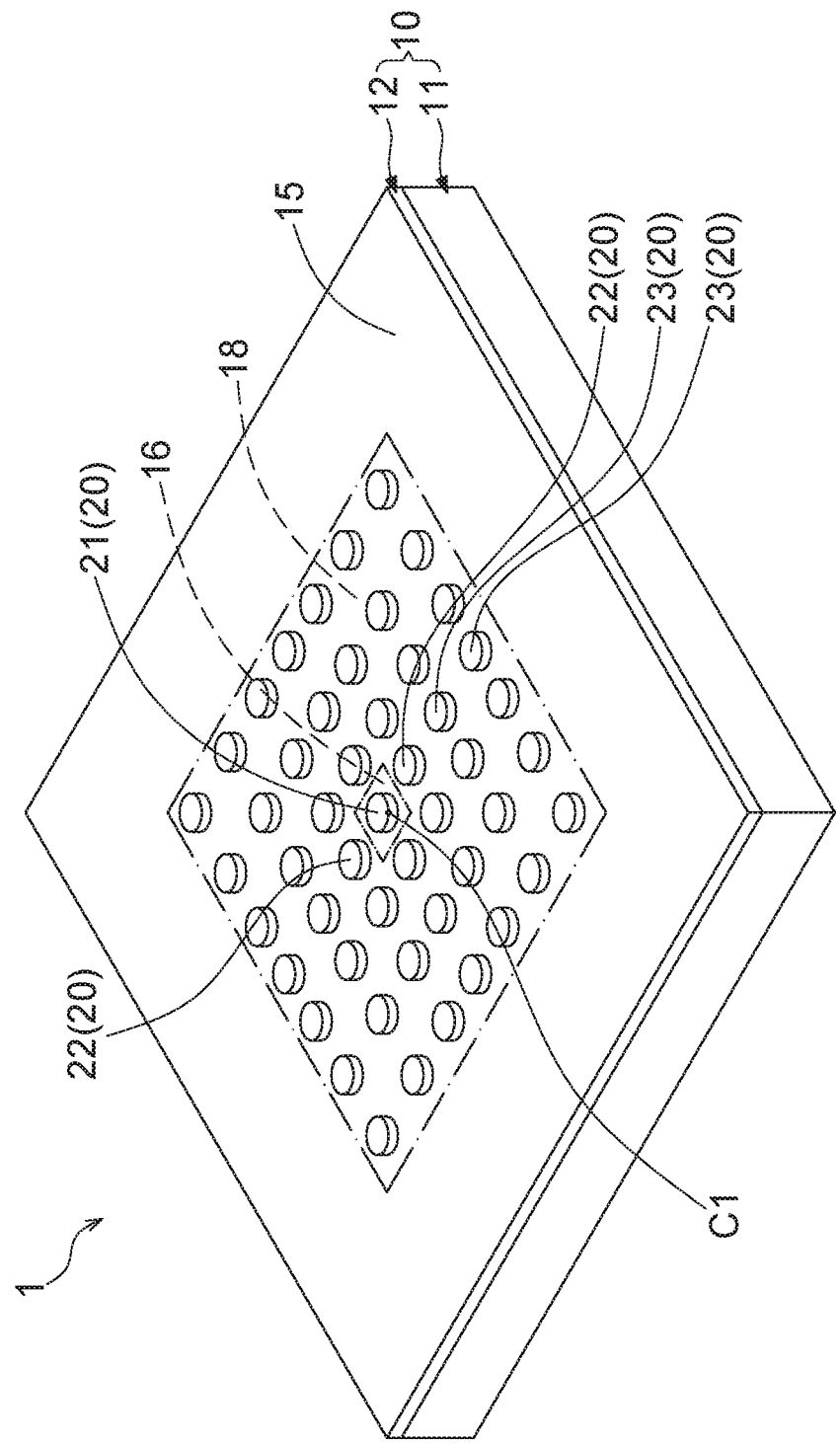
FIG. 1 illustrates a perspective view of a device structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
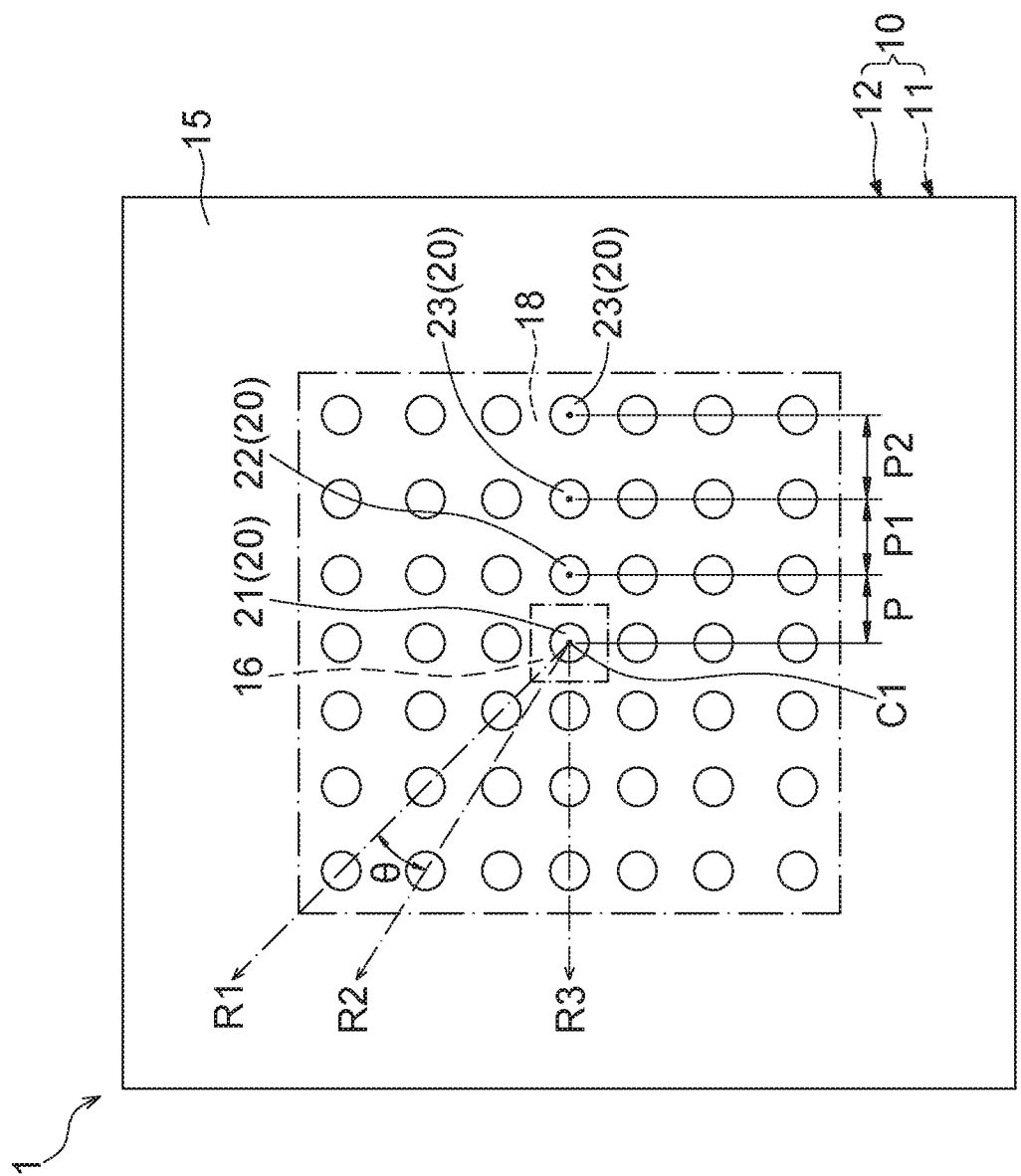
FIG. 2 illustrates a top view of FIG. 1.
Figure 3:
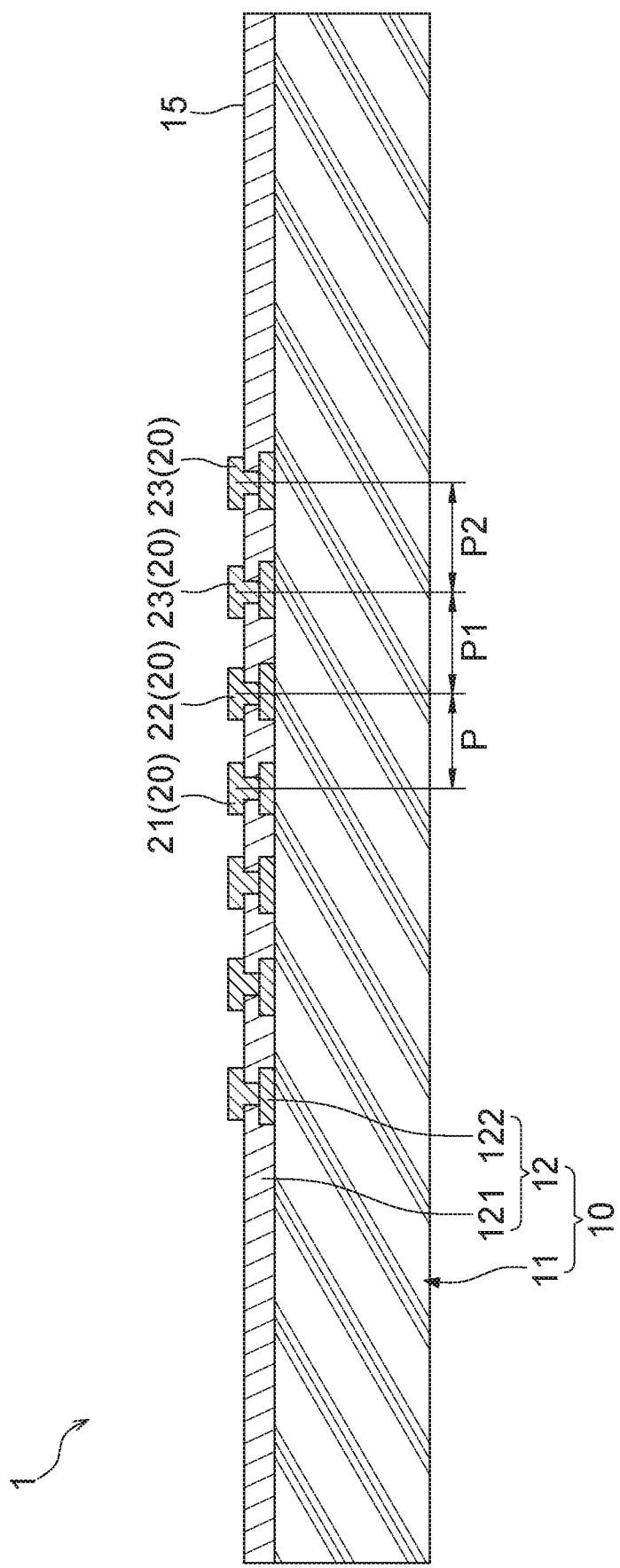
FIG. 3 illustrates a cross-sectional view of FIG. 1.

FIG. 1 illustrates a perspective view of a device structure 1 according to some embodiments of the present disclosure. FIG. 2 illustrates a top view of FIG. 1. FIG. 3 illustrates a cross-sectional view of FIG. 1. Referring to FIG. 1 through FIG. 3, the device structure 1 includes a first electronic structure 10 and a plurality of first electric contacts 20.

The first electronic structure 10 may be, for example, a substrate or a semiconductor die. The first electronic structure 10 has a surface 15 (e.g., a top surface), a central area 16, a peripheral area 18 and a center C1. The central area 16 and the peripheral area 18 are defined on the surface 15. The peripheral area 18 surrounds the central area 16. The center C1 is within the central area 16. Further, the first electronic structure 10 may define a plurality of axes (including, for example, the axes R1, R2, R3) extending through the center C1. As shown in FIG. 2, there is an included angle θ between two nearest axes (e.g., the axes R1 and R2).

As shown in FIG. 1 and FIG. 3, the first electronic structure 10 may include a base 11 and a redistribution structure 12. A material of the base 11 may be, for example, organic material or inorganic material. The redistribution structure 12 may be disposed on the base 11 (e.g., a top surface of the base 11). The surface 15 may be a top surface of the redistribution structure 12. In some embodiments, the redistribution structure 12 may include at least one dielectric layer 121 and at least one circuit layer 122. The circuit layer 122 is embedded in the dielectric layer 121.

The first electric contacts 20 are disposed on and electrically connected to the redistribution structure 12 of the first electronic structure 10. The first electric contacts 20 may be metal pads or metal bumps. In some embodiments, the first electric contacts 20 may extend through the dielectric layer 121 and be electrically connected to the circuit layer 122 of the redistribution structure 12. Further, the first electric contacts 20 are exposed from the surface 15 (e.g., the top surface of the redistribution structure 12) of the first electronic structure 10.

As shown in FIG. 2 and FIG. 3, the first electric contacts 20 are spaced by a pitch (including, for example, the pitch P, the pitch P1 and the pitch P2) that increases with increasing distance from the center C1 of the first electronic structure 10. The first electric contacts 20 may be disposed at the axes (including, for example, the axes R1, R2, R3). In some embodiments, the centers of the first electric contacts 20 may be disposed at the axes (including, for example, the axes R1, R2, R3). That is, the axes (including, for example, the axes R1, R2, R3) extend through the centers of the first electric contacts 20. As shown in FIG. 2 and FIG. 3, the first electric contacts 20 are arranged in an array with a plurality of concentric loops. The loops of first electric contacts 20 are spaced by a pitch (including, for example, the pitch P, the pitch P1 and the pitch P2) that increases with increasing distance from the center C1 of the first electronic structure 10.

The first electric contacts 20 may include at least one central electric contact 21, a plurality of inner electric contacts 22 and a plurality of outer electric contacts 23. The central electric contact 21 is disposed in the central area 16 of the first electronic structure 10. For example, the central electric contact 21 may be disposed at the center C1. However, there may be a plurality of central electric contacts 21 disposed in the central area 16. The inner electric contacts 22 are disposed in the peripheral area 18 and adjacent to the central area 16. The outer electric contacts 23 are disposed in the peripheral area 18 and far away the central area 16. In some embodiments, the pitch P1 between the outer electric contact 23 and the inner electric contact 22 nearest to the outer electric contact 23 may be greater than the pitch P between the inner electric contact 22 and the central electric contact 21 nearest to the inner electric contact 22. Further, the pitch P2 between two adjacent outer electric contacts 23 may be greater than the pitch P1 between the outer electric contact 23 and the inner electric contact 22 nearest to the outer electric contact 23.

As shown in the embodiment illustrated in FIG. 1 through FIG. 3, the first electric contacts 20 (including, for example, the central electric contact 21, the inner electric contacts 22 and the outer electric contacts 23) are spaced by the pitch (including, for example, the pitch P, the pitch P1 and the pitch P2) that increases with increasing distance from the center C1 of the first electronic structure 10. The designed pitch (including, for example, the pitch P, the pitch P1 and the pitch P2) between the first electric contacts 20 (including, for example, the central electric contact 21, the inner electric contacts 22 and the outer electric contacts 23) may correct positional deviations of the first electric contacts 20 caused by the outward displacement of the first electric contacts 20 due to thermal expansion in a solder reflow process, thereby preventing the first electric contacts 20 from misalignment in the solder reflow process.

Figure 4:
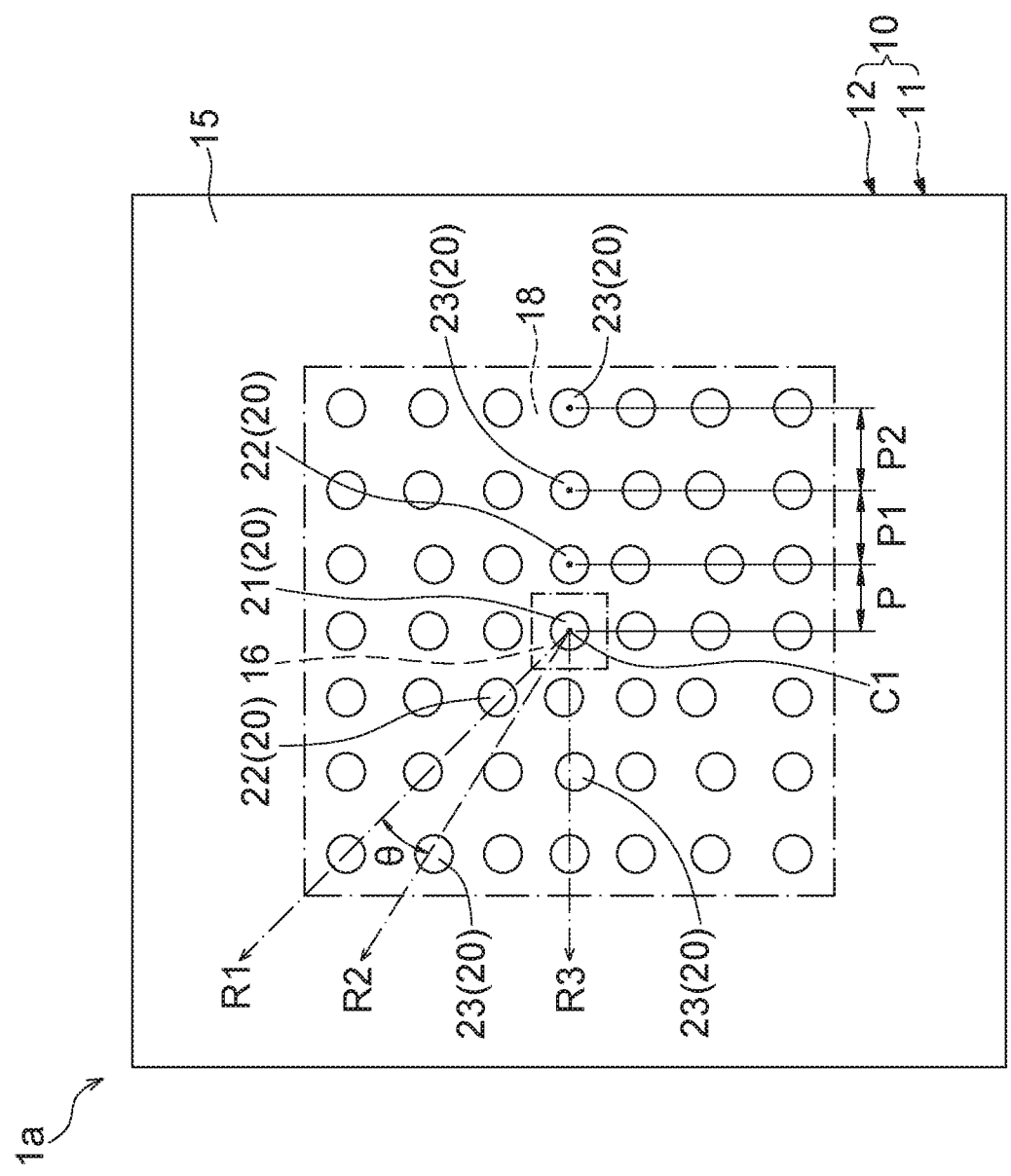
FIG. 4 illustrates a top view of a device structure according to some embodiments of the present disclosure.

FIG. 4 illustrates a top view of a device structure 1a according to some embodiments of the present disclosure. The device structure 1a is similar to the device structure 1 shown in FIG. 1 through FIG. 3, except for the configurations of the first electric contacts 20. In some embodiments, the centers of some of the first electric contacts 20 may not be disposed at the axes (including, for example, the axes R1, R2, R3). That is, the axes (including, for example, the axes R1, R2, R3) may not extend through the centers of some of the first electric contacts 20. There may be a shift between the axes (including, for example, the axes R1, R2, R3) and the centers of some of the first electric contacts 20.

Figure 5:
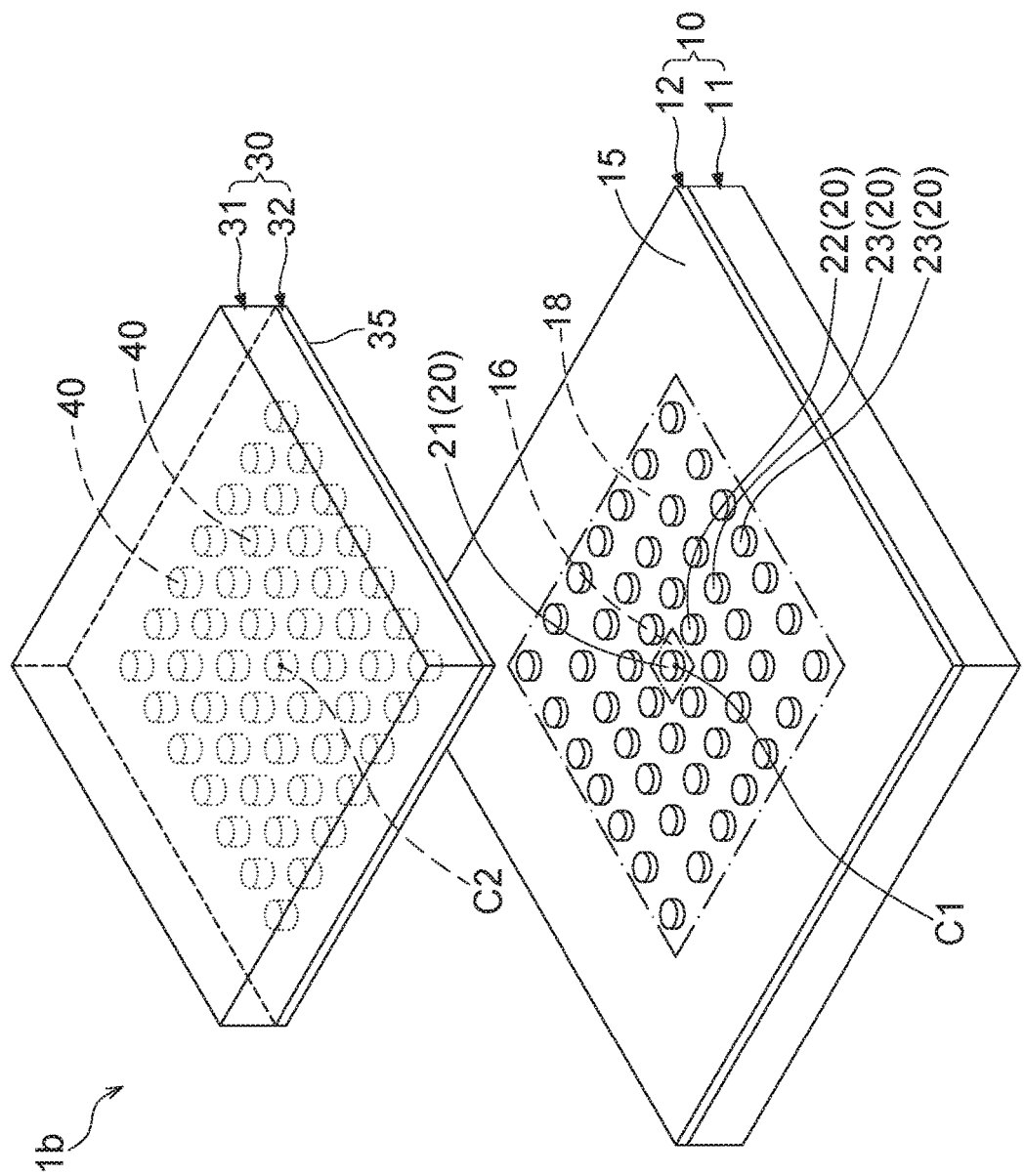
FIG. 5 illustrates an exploded view of a device structure according to some embodiments of the present disclosure.
Figure 6:
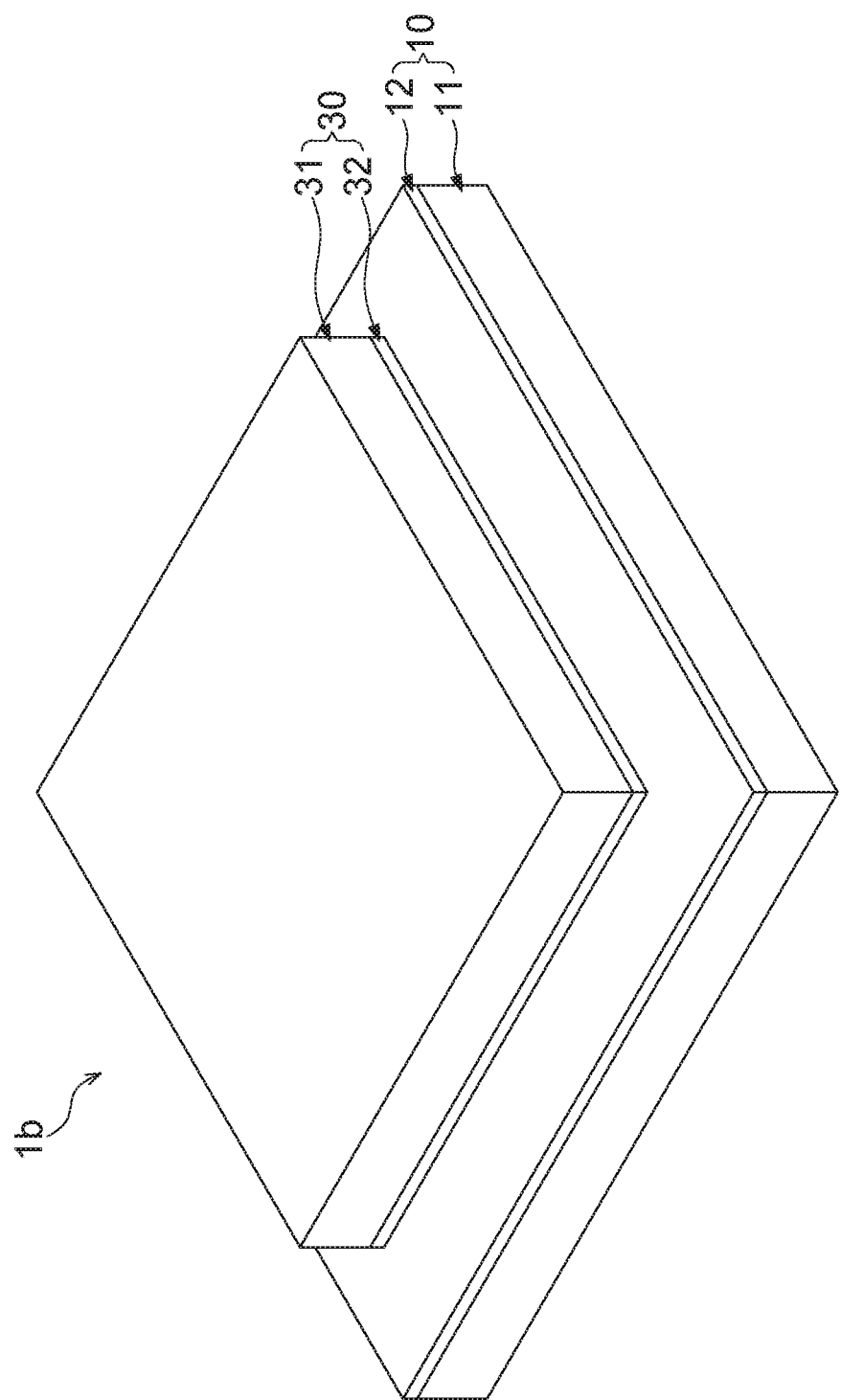
FIG. 6 illustrates an assembled view of FIG. 5.
Figure 7:
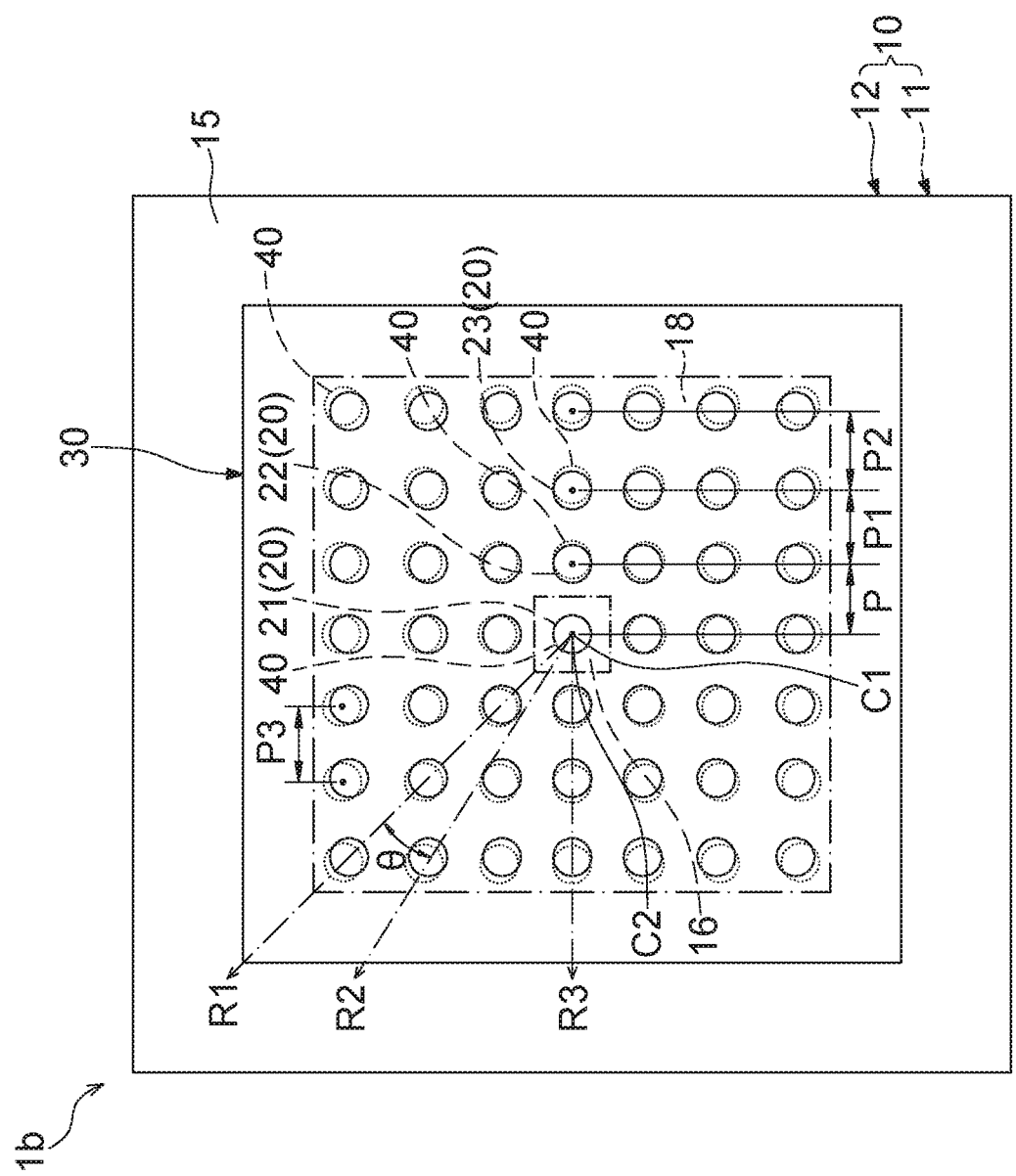
FIG. 7 illustrates a top view of FIG. 6.
Figure 8:
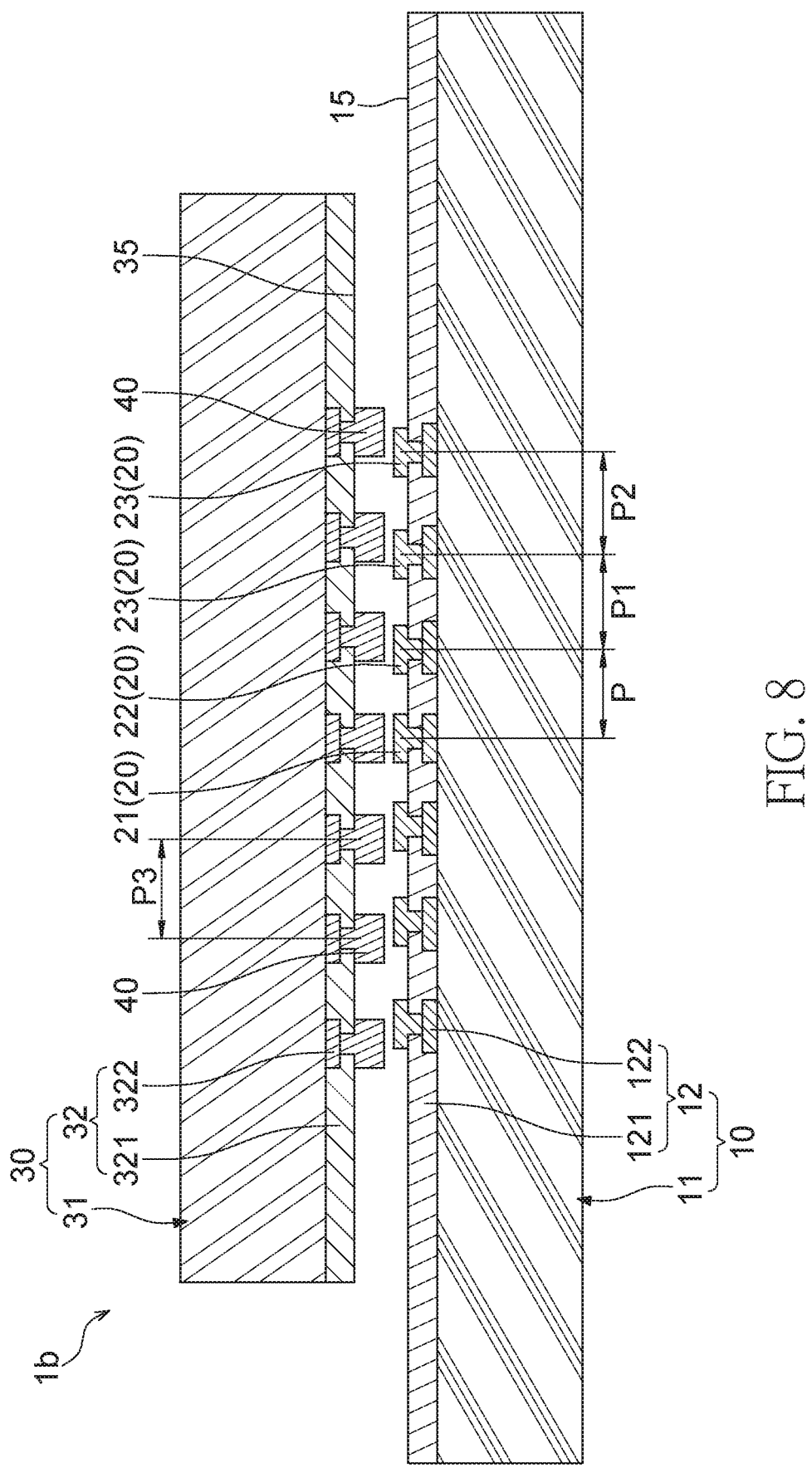
FIG. 8 illustrates a cross-sectional view of FIG. 6.

FIG. 5 illustrates an exploded view of a device structure 1b according to some embodiments of the present disclosure. FIG. 6 illustrates an assembled view of FIG. 5. FIG. 7 illustrates a top view of FIG. 6. FIG. 8 illustrates a cross-sectional view of FIG. 6. Referring to FIG. 5 through FIG. 8, the device structure 1b is similar to the device structure 1 shown in FIG. 1 through FIG. 3, except that the device structure 1b further includes a second electronic structure 30 and a plurality of second electric contacts 40.

The second electronic structure 30 may be, for example, a substrate or a semiconductor die. The second electronic structure 30 corresponds to the first electronic structure 10. The second electronic structure 30 has a surface 35 (e.g., a bottom surface) and a center C2. The surface 35 faces the first electronic structure 10. The center C2 corresponds to the center C1 of the first electronic structure 10.

As shown in FIG. 5 and FIG. 8, the second electronic structure 30 may include a base 31 and a circuit structure 32. A material of the base 31 may be, for example, organic material or inorganic material. The circuit structure 32 may be disposed on the base 31 (e.g., a bottom surface of the base 31). The surface 35 may be a bottom surface of the circuit structure 32. In some embodiments, the circuit structure 32 may include at least one passivation layer 321 and at least one circuit layer 322. The circuit layer 322 is embedded in the passivation layer 321.

As shown in FIG. 7 and FIG. 8, the second electric contacts 40 correspond to the first electric contacts 20. The second electric contacts 40 are disposed on and electrically connected to the circuit structure 32 of the second electronic structure 30. The second electric contacts 40 may be metal pads or metal bumps. In some embodiments, the second electric contacts 40 may extend through the passivation layer 321 and be electrically connected to the circuit layer 322 of the circuit structure 32. Further, the second electric contacts 40 are exposed from the surface 35 (e.g., the bottom surface of the circuit structure 32) of the second electronic structure 30.

In some embodiments, a pitch P3 between two adjacent second electric contacts 40 may be greater than the pitch P between the inner electric contact 22 and the central electric contact 21 nearest to the inner electric contact 22 and the pitch P1 between the outer electric contact 23 and the inner electric contact 22 nearest to the outer electric contact 23. Further, the pitches P3 between the second electric contacts 40 may be substantially the same.

In some embodiments, the first electronic structure 10 may be a substrate, thus, the first electric contacts 20 may be metal pads. The second electronic structure 30 may be a semiconductor die, thus, the second electric contacts 40 may be metal bumps. That is, the coefficient of thermal expansion (CTE) of the first electronic structure 10 may be greater than the CTE of the second electronic structure 30, and the first electric contacts 20 (e.g., metal pads) may generate an outward displacement relative to the corresponding second electric contacts 40 (e.g., metal bumps) due to thermal expansion in the solder reflow process.

Figure 9:
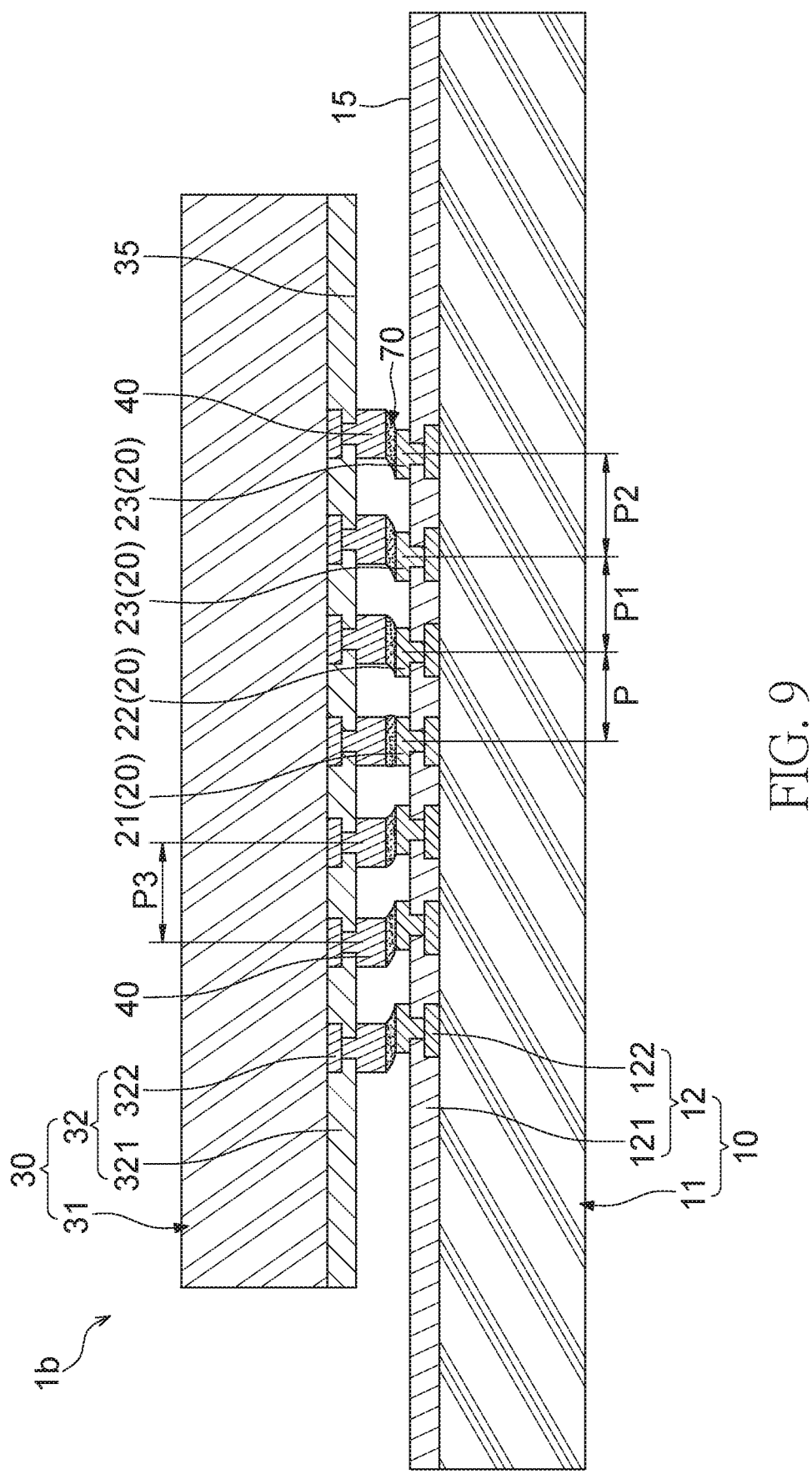
FIG. 9 illustrates a cross-sectional view of FIG. 6 during a solder reflow process.
Figure 10:
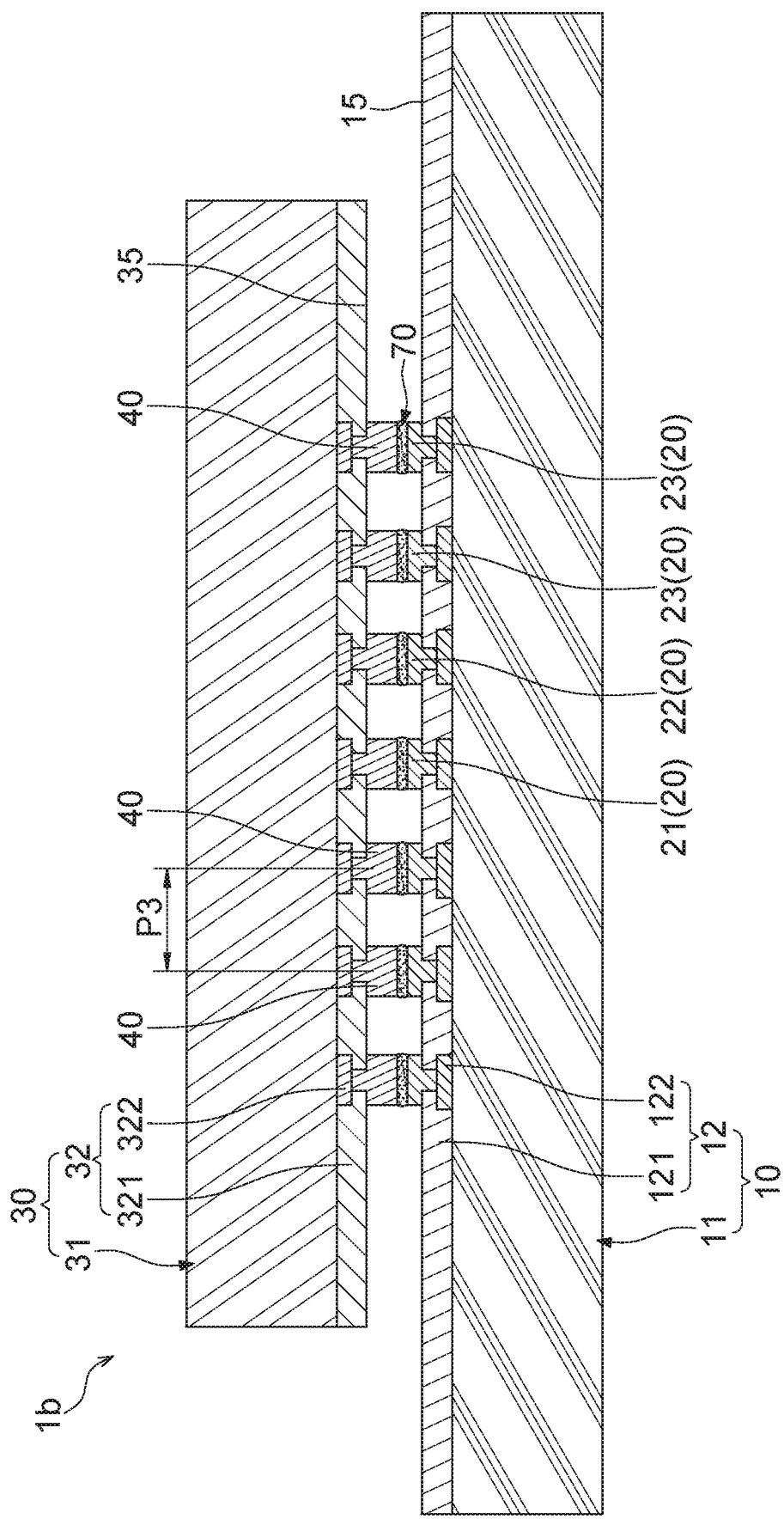
FIG. 10 illustrates a cross-sectional view of FIG. 6 after a solder reflow process.

FIG. 9 illustrates a cross-sectional view of FIG. 6 during a solder reflow process. FIG. 10 illustrates a cross-sectional view of FIG. 6 after a solder reflow process. Referring to FIG. 9 and FIG. 10, the second electric contacts 40 may be bonded to the first electric contacts 20 (including, for example, the central electric contact 21, the inner electric contacts 22 and the outer electric contacts 23) through at least one solder material 70. As shown in FIG. 9, during the solder reflow process, the solder material 70 are melted to join the second electric contacts 40 and the first electric contacts 20 (including, for example, the central electric contact 21, the inner electric contacts 22 and the outer electric contacts 23). As shown in FIG. 9, the first electric contacts 20 disposed in the peripheral area 18 (e.g., the inner electric contacts 22 and the outer electric contacts 23) are misaligned with the corresponding second electric contacts 40 at the beginning of the solder reflow process. The misalignment may cause the solder material 70, the first electric contacts 20 or the second electric contacts 40 to crack during a reliability test.

As shown in FIG. 10, the designed pitch (including, for example, the pitch P, the pitch P1 and the pitch P2) between the first electric contacts 20 (including, for example, the central electric contact 21, the inner electric contacts 22 and the outer electric contacts 23) may correct positional deviations of the first electric contacts 20 caused by the outward displacement of the first electric contacts 20, thereby preventing the first electric contacts 20 from misalignment with the second electric contacts 40 in the solder reflow process. Thus, after the solder reflow process, the first electric contacts 20 (including, for example, the central electric contact 21, the inner electric contacts 22 and the outer electric contacts 23) are aligned with the second electric contacts 40.

Figure 11:
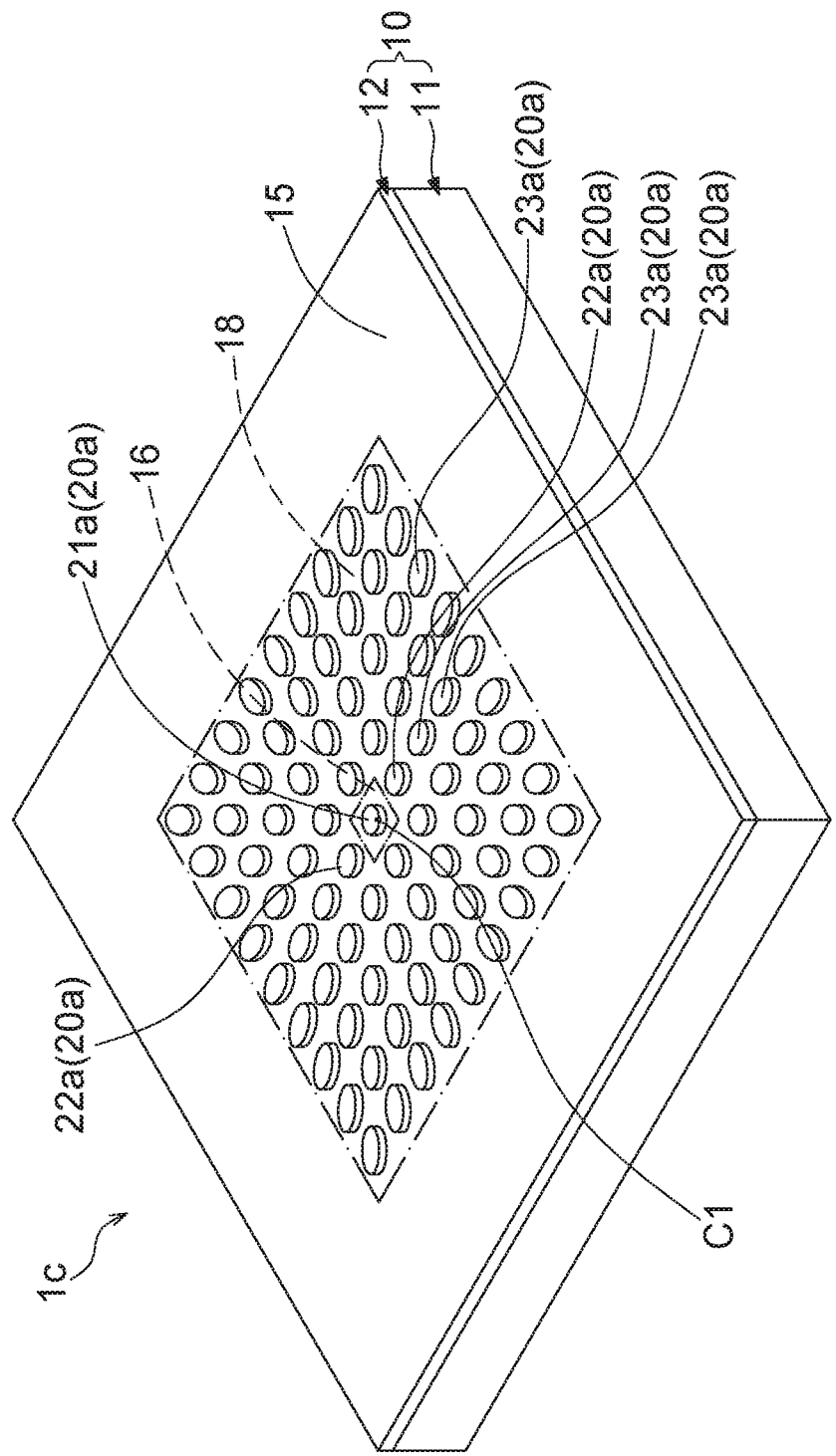
FIG. 11 illustrates a perspective view of a device structure according to some embodiments of the present disclosure.
Figure 12:
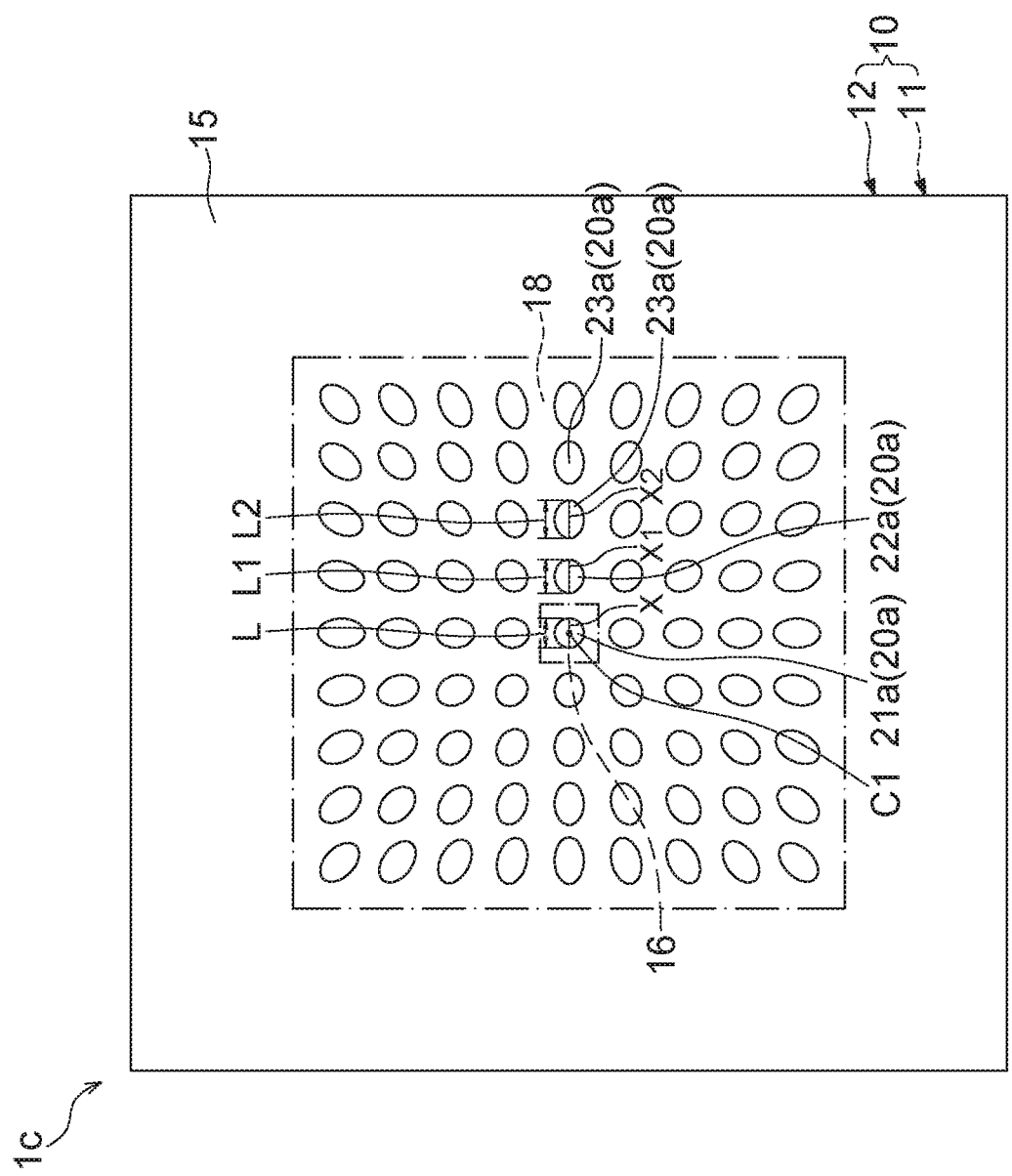
FIG. 12 illustrates a top view of FIG. 11.
Figure 13:
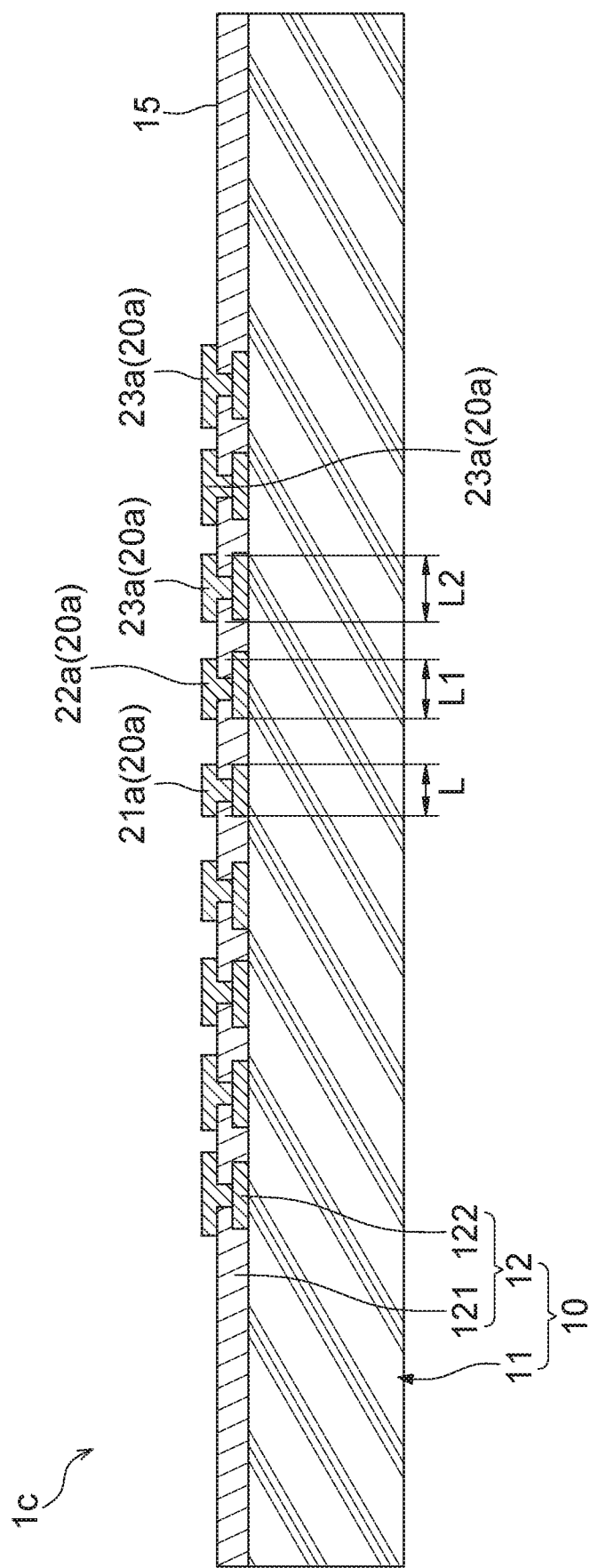
FIG. 13 illustrates a cross-sectional view of FIG. 11.

FIG. 11 illustrates a perspective view of a device structure 1c according to some embodiments of the present disclosure. FIG. 12 illustrates a top view of FIG. 11. FIG. 13 illustrates a cross-sectional view of FIG. 11. Referring to FIG. 11 through FIG. 13, the device structure 1c is similar to the device structure 1 shown in FIG. 1 through FIG. 3, except for the structures of the first electric contacts 20a. In some embodiments, each of the first electric contacts 20a has a maximum length (including, for example, the maximum length L, the maximum length L1 and the maximum length L2) along a long axis (including, for example, the long axis X, the long axis X1 and the long axis X2) thereof. The long axis (including, for example, the long axis X, the long axis X1 and the long axis X2) extends through the center C1 of the first electronic structure 10. The maximum length (including, for example, the maximum length L, the maximum length L1 and the maximum length L2) of each of the first electric contacts 20a increases with increasing distance from the center C1 of the first electronic structure 10.

The first electric contacts 20a may include at least one central electric contact 21a, a plurality of inner electric contacts 22a and a plurality of outer electric contacts 23a. The central electric contact 21a is disposed in the central area 16 of the first electronic structure 10. The inner electric contacts 22a are disposed in the peripheral area 18 and adjacent to the central area 16. The outer electric contacts 23a are disposed in the peripheral area 18 and far away the central area 16. In some embodiments, the maximum length L1 of each of the inner electric contacts 22a may be greater than the maximum length L of the central electric contact 21a, and the maximum length L2 of each of the outer electric contacts 23a may greater than the maximum length L1 of each of the inner electric contacts 22a. In some embodiments, the first electric contacts 20a (including, for example, the inner electric contacts 22a and the outer electric contacts 23a) may be in an oval shape.

As shown in the embodiment illustrated in FIG. 11 through FIG. 13, the maximum length (including, for example, the maximum length L, the maximum length L1 and the maximum length L2) of each of the first electric contacts 20a increases with increasing distance from the center C1 of the first electronic structure 10. The designed maximum length (including, for example, the maximum length L, the maximum length L1 and the maximum length L2) of each of the first electric contacts 20a may compensate positional deviations of the first electric contacts 20a caused by the outward displacement of the first electric contacts 20a due to thermal expansion in the solder reflow process, thereby preventing the first electric contacts 20a from misalignment in the solder reflow process.

Figure 14:
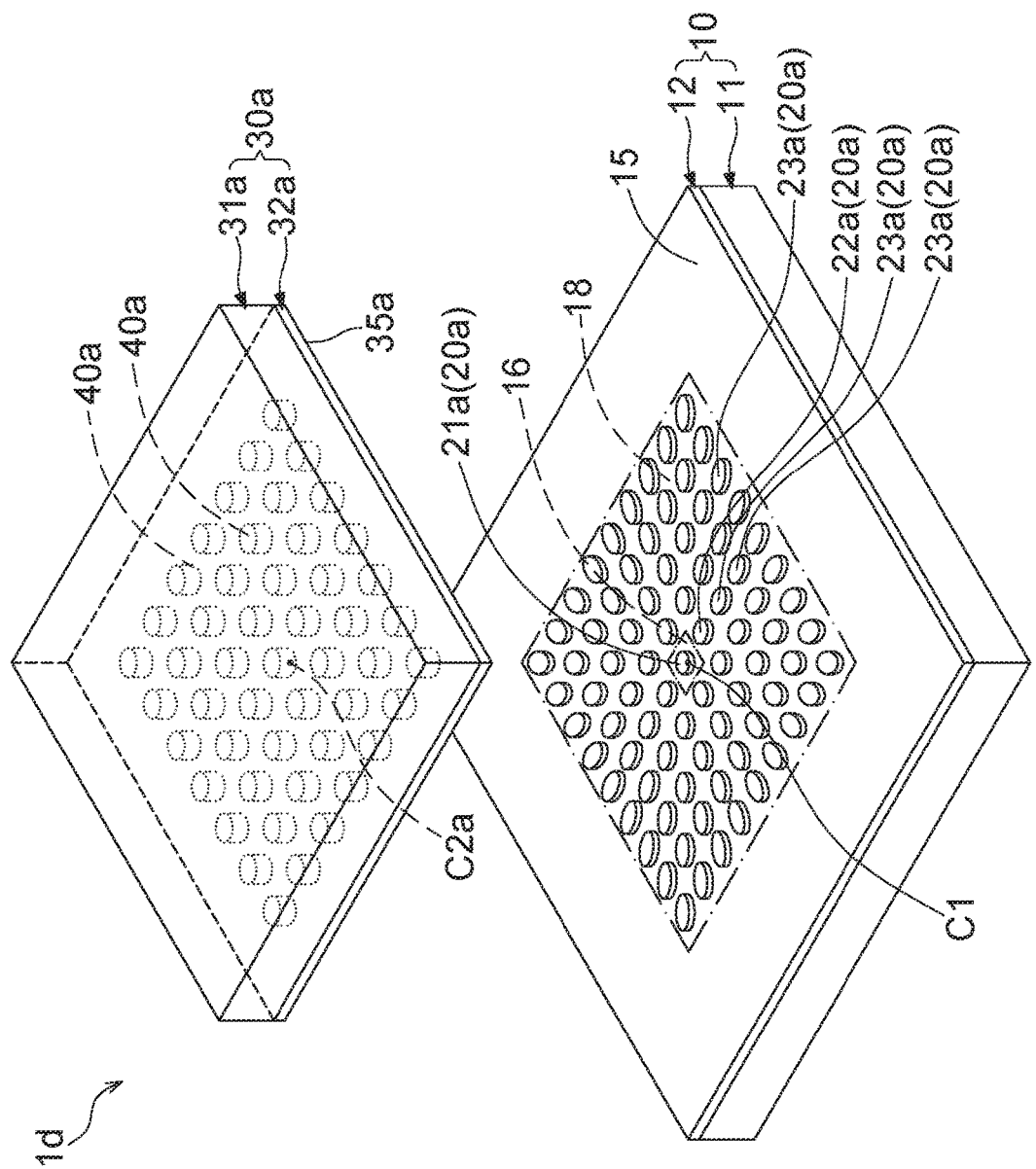
FIG. 14 illustrates an exploded view of a device structure according to some embodiments of the present disclosure.
Figure 15:
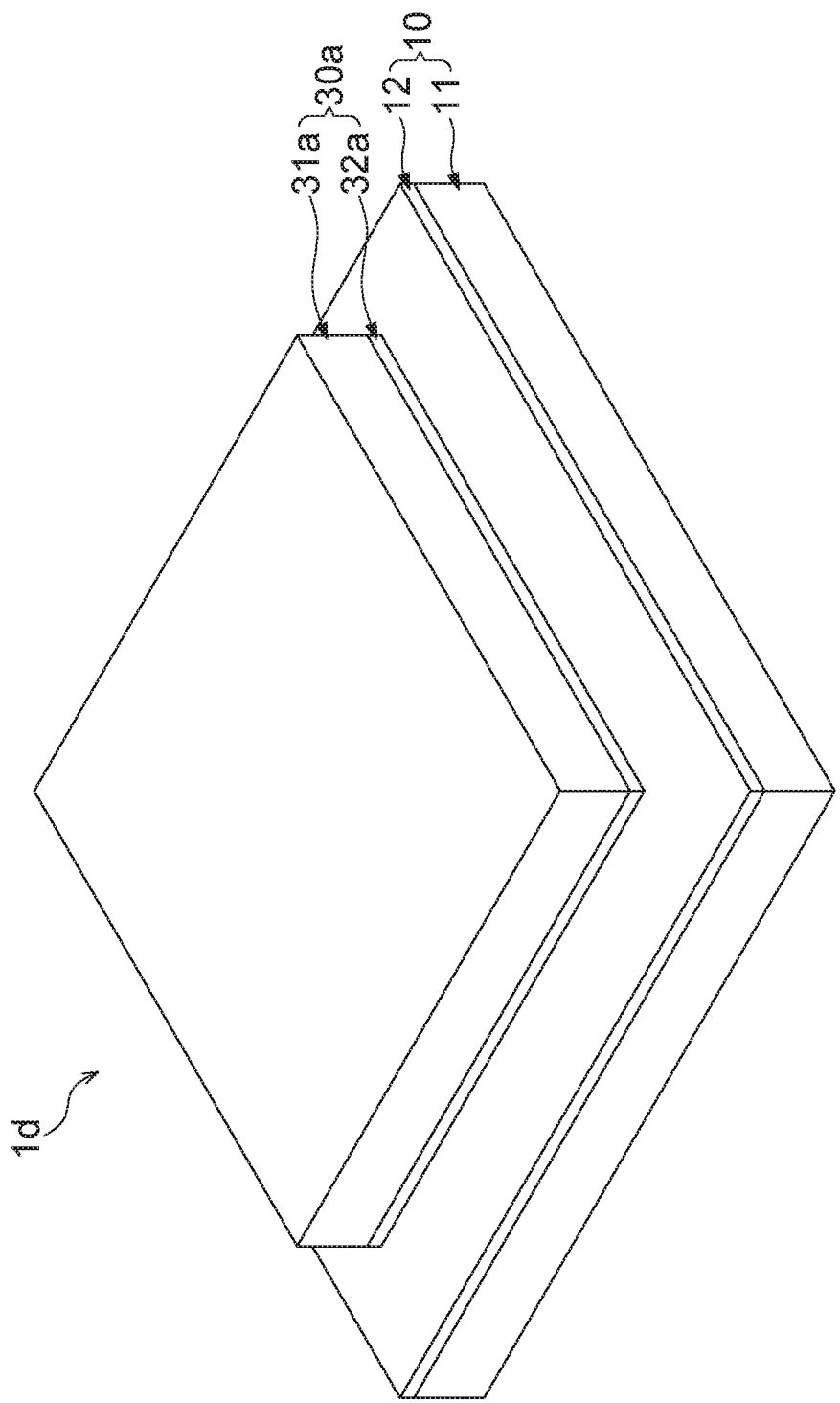
FIG. 15 illustrates an assembled view of FIG. 14.
Figure 16:
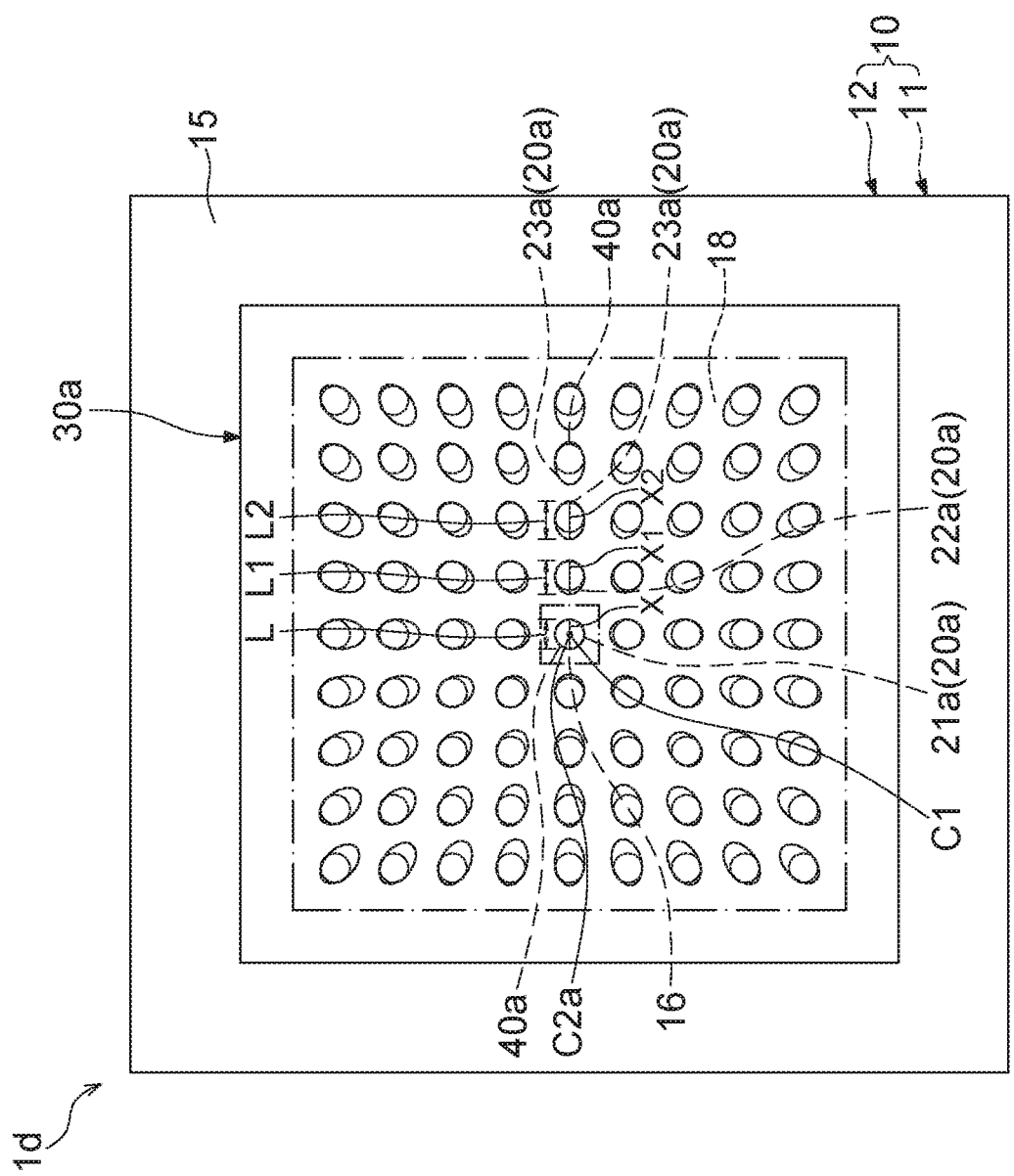
FIG. 16 illustrates a top view of FIG. 15.
Figure 17:
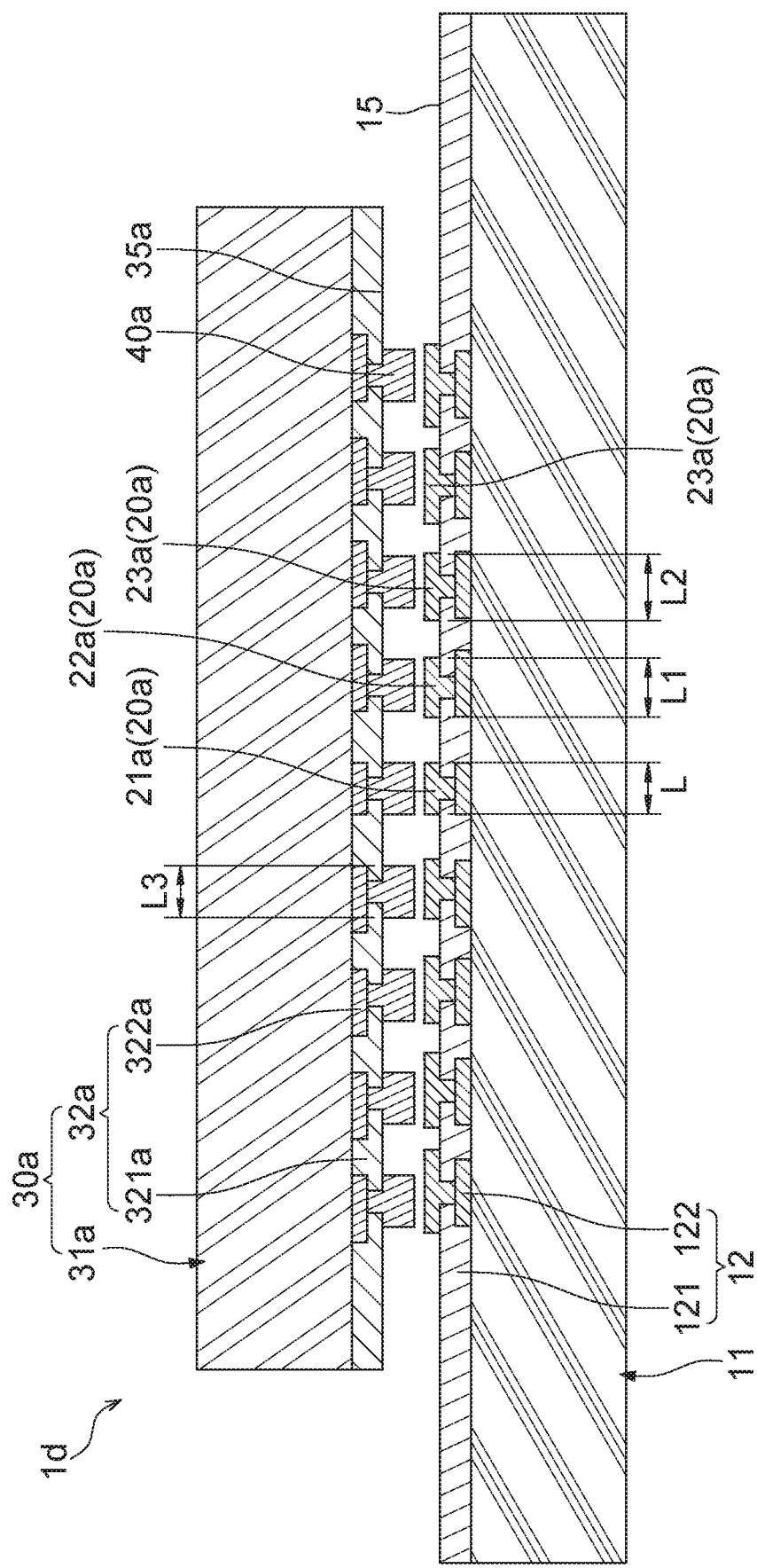
FIG. 17 illustrates a cross-sectional view of FIG. 15.

FIG. 14 illustrates an exploded view of a device structure 1d according to some embodiments of the present disclosure. FIG. 15 illustrates an assembled view of FIG. 14. FIG. 16 illustrates a top view of FIG. 15. FIG. 17 illustrates a cross-sectional view of FIG. 15. Referring to FIG. 14 through FIG. 17, the device structure 1d is similar to the device structure 1c shown in FIG. 11 through FIG. 13, except that the device structure 1d further includes a second electronic structure 30a and a plurality of second electric contacts 40a.

The second electronic structure 30a may be, for example, a substrate or a semiconductor die. The second electronic structure 30a corresponds to the first electronic structure 10.

The second electronic structure 30a has a surface 35a (e.g., a bottom surface) and a center C2a. The surface 35a faces the first electronic structure 10. The center C2a corresponds to the center C1 of the first electronic structure 10.

As shown in FIG. 14 and FIG. 17, the second electronic structure 30a may include a base 31a and a circuit structure 32a. A material of the base 31a may be, for example, organic material or inorganic material. The circuit structure 32a may be disposed on the base 31a (e.g., a bottom surface of the base 31a). The surface 35a may be a bottom surface of the circuit structure 32a. In some embodiments, the circuit structure 32a may include at least one passivation layer 321a and at least one circuit layer 322a. The circuit layer 322a is embedded in the passivation layer 321a.

As shown in FIG. 16 and FIG. 17, the second electric contacts 40a correspond to the first electric contacts 20a. The second electric contacts 40a are disposed on and electrically connected to the circuit structure 32a of the second electronic structure 30a. In some embodiments, the second electric contacts 40a may extend through the passivation layer 321a and be electrically connected to the circuit layer 322a of the circuit structure 32a. Further, the second electric contacts 40a are exposed from the surface 35a (e.g., the bottom surface of the circuit structure 32a) of the second electronic structure 30a.

In some embodiments, the maximum length L1 of each of the inner electric contacts 22a may be greater than a maximum length L3 of each of the second electric contacts 40a, and the maximum length L2 of each of the outer electric contacts 23a may also be greater than the maximum length L3 of each of the second electric contacts 40a.

In some embodiments, the first electronic structure 10 may be a substrate, thus, the first electric contacts 20a may be metal pads. The second electronic structure 30a may be a semiconductor die, thus, the second electric contacts 40a may be metal bumps. That is, the CTE of the first electronic structure 10 may be greater than the CTE of the second electronic structure 30a, and the first electric contacts 20a (e.g., metal pads) may generate an outward displacement relative to the corresponding second electric contacts 40a (e.g., metal bumps) due to thermal expansion in the solder reflow process.

Figure 18:
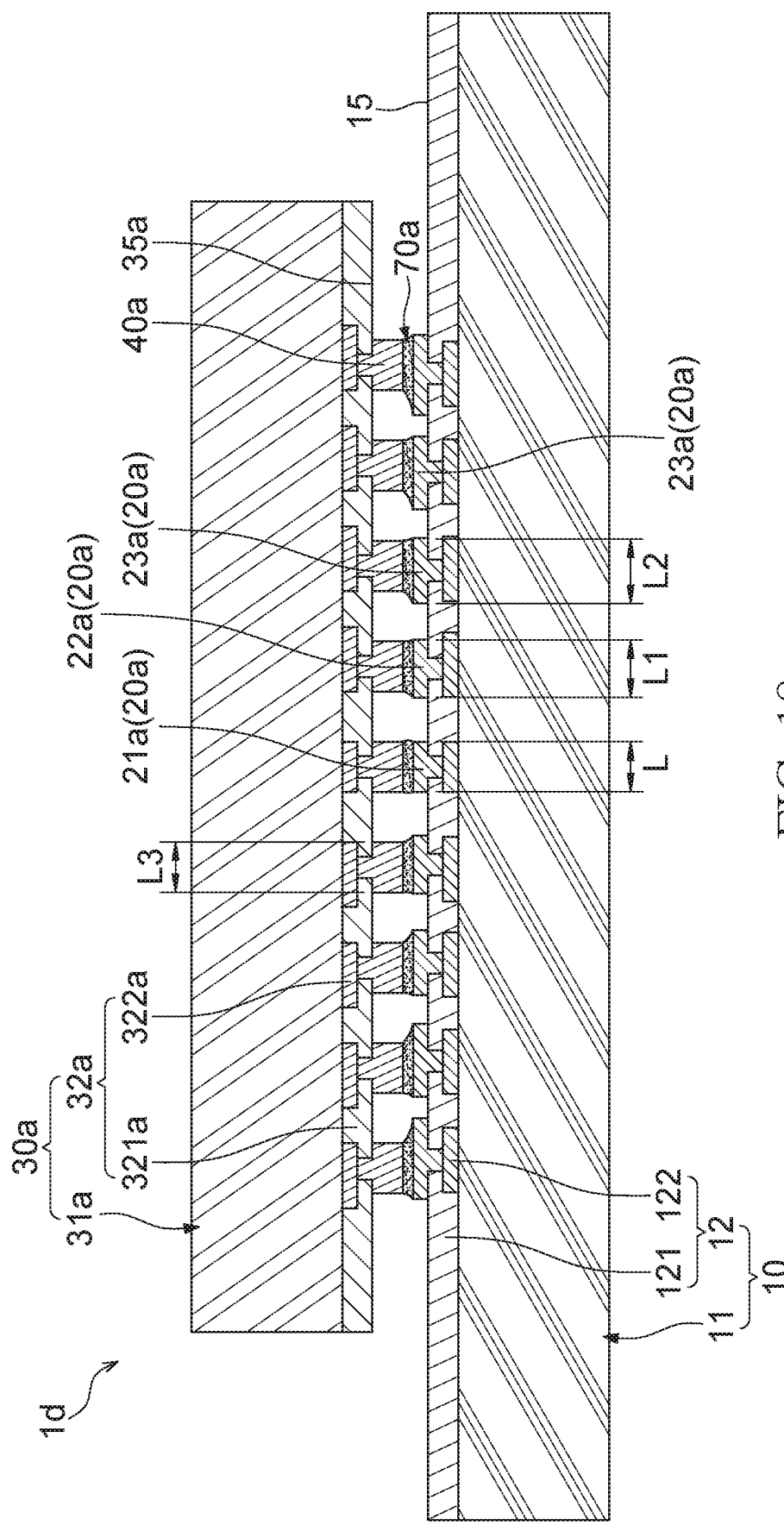
FIG. 18 illustrates a cross-sectional view of FIG. 15 during a solder reflow process.
Figure 19:
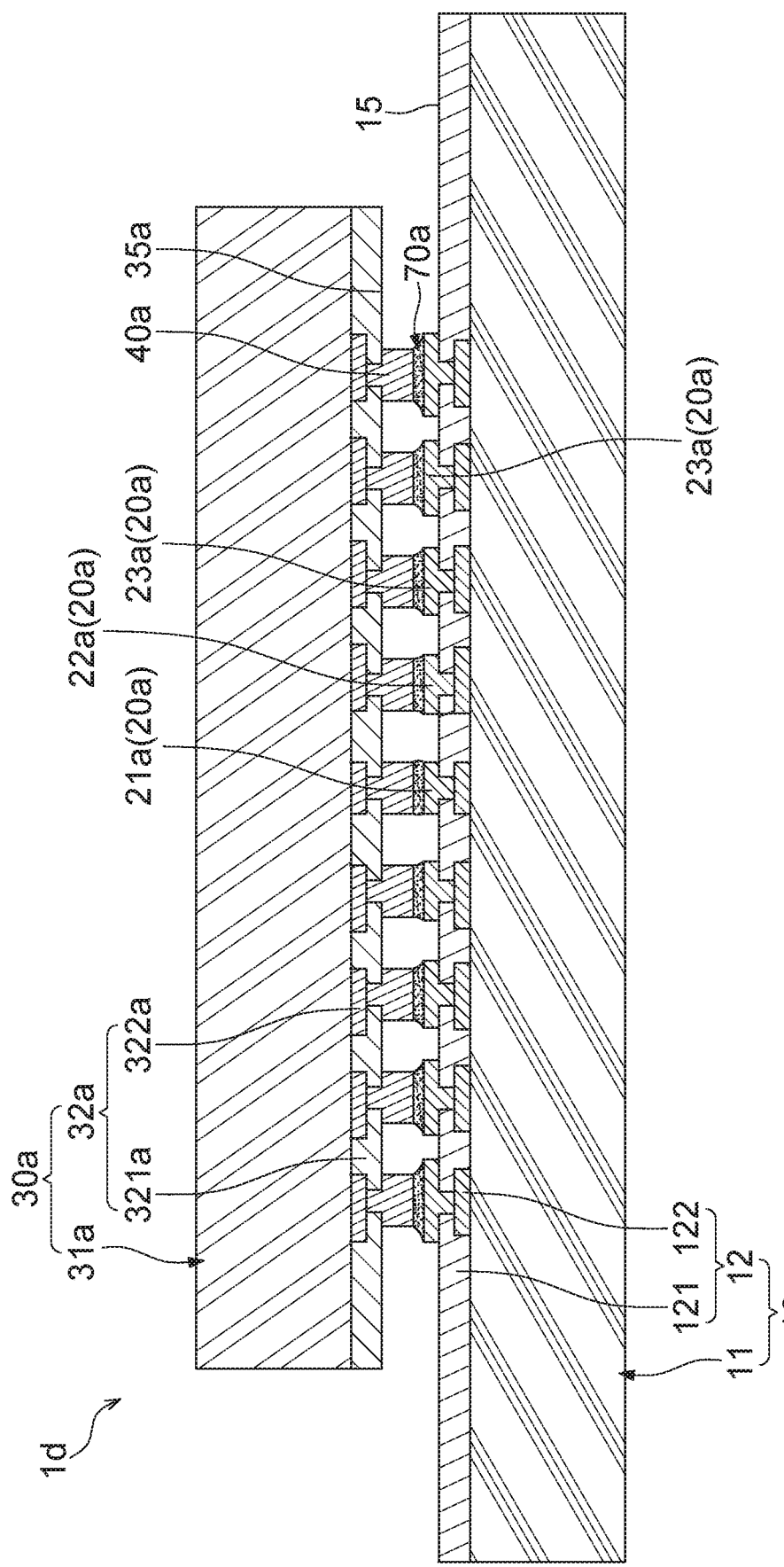
FIG. 19 illustrates a cross-sectional view of FIG. 15 after a solder reflow process.

FIG. 18 illustrates a cross-sectional view of FIG. 15 during a solder reflow process. FIG. 19 illustrates a cross-sectional view of FIG. 15 after a solder reflow process. Referring to FIG. 18 and FIG. 19, the second electric contacts 40a may be bonded to the first electric contacts 20a (including, for example, the central electric contact 21a, the inner electric contacts 22a and the outer electric contacts 23a) through at least one solder material 70a. As shown in FIG. 18, during the solder reflow process, the solder material 70a are melted to join the second electric contacts 40a and the first electric contacts 20a (including, for example, the central electric contact 21a, the inner electric contacts 22a and the outer electric contacts 23a). As shown in FIG. 19, the designed maximum length (including, for example, the maximum length L, the maximum length L1 and the maximum length L2) of each of the first electric contacts 20a (including, for example, the central electric contact 21a, the inner electric contacts 22a and the outer electric contacts 23a) may compensate positional deviations of the first electric contacts 20a caused by the outward displacement of the first electric contacts 20a, thereby preventing the first electric contacts 20a from misalignment with the second electric contacts 40a in the solder reflow process.

Figure 20:
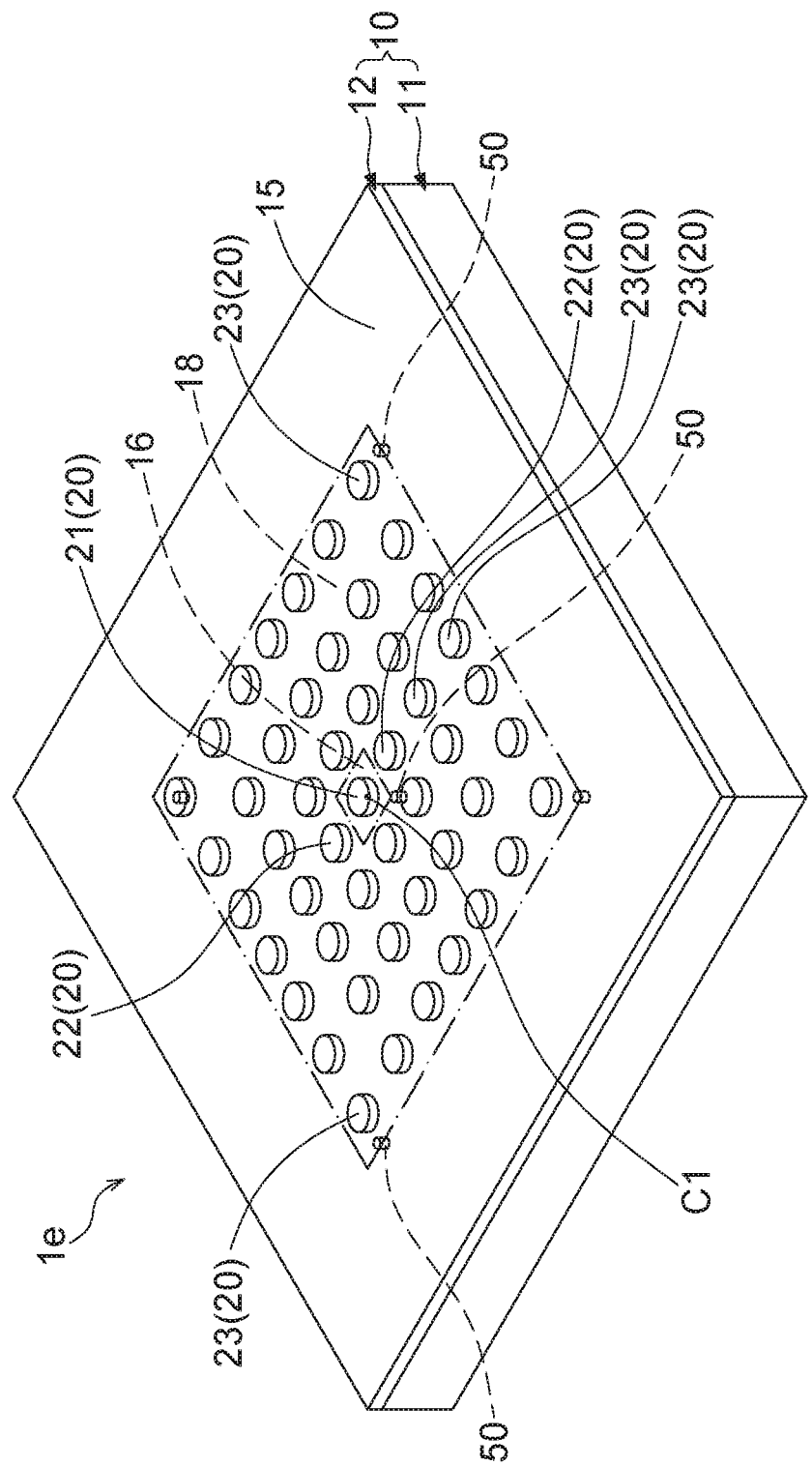
FIG. 20 illustrates a perspective view of a device structure according to some embodiments of the present disclosure.
Figure 21:
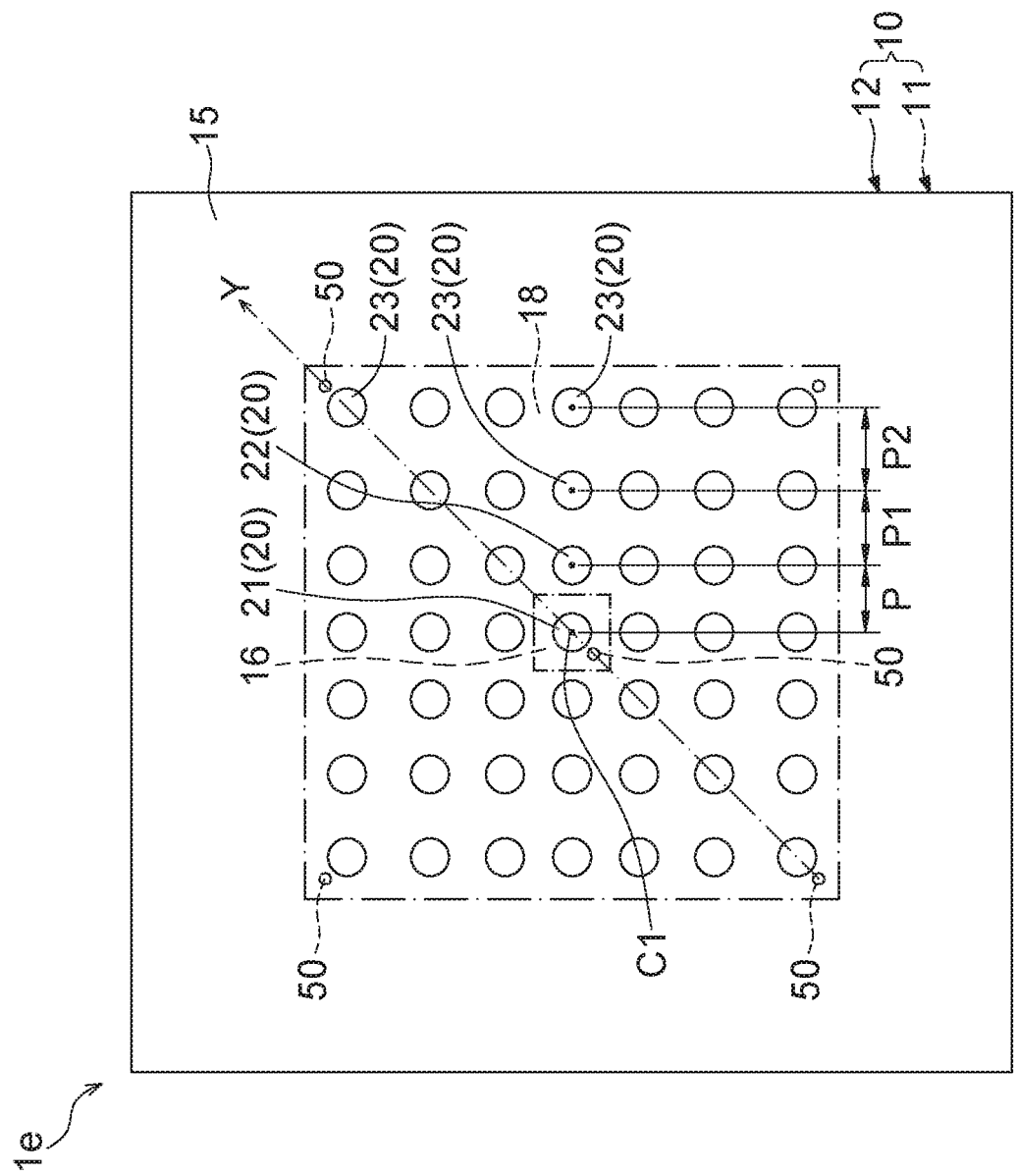
FIG. 21 illustrates a top view of FIG. 20.
Figure 22:
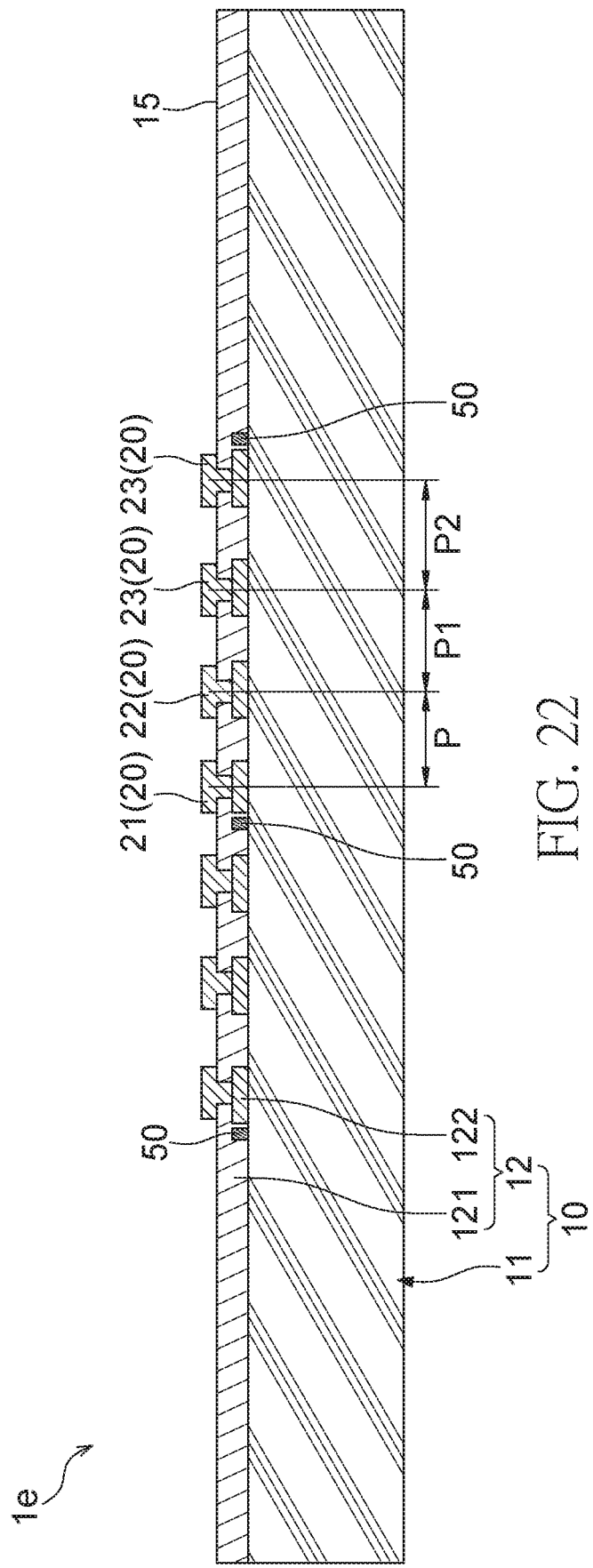
FIG. 22 illustrates a cross-sectional view of FIG. 20.

FIG. 20 illustrates a perspective view of a device structure 1e according to some embodiments of the present disclosure. FIG. 21 illustrates a top view of FIG. 20. FIG. 22 illustrates a cross-sectional view of FIG. 20. Referring to FIG. 20 through FIG. 22, the device structure 1e is similar to the device structure 1 shown in FIG. 1 through FIG. 3, except that the device structure 1e further includes at least one alignment mark 50. The alignment mark 50 may be disposed adjacent to at least one of the first electric contacts 20. In some embodiments, the alignment mark 50 may be disposed adjacent to the outer electric contact 23 or the central electric contact 21.

As shown in FIG. 21, the alignment mark 50 may be disposed at an axis Y extending through the center C1 of the first electronic structure 10. Further, the axis Y may extend through a center of the first electric contact 20 (e.g., the outer electric contact 23). In addition, the first electric contact 20 may be disposed between the center C1 of the first electronic structure 10 and the alignment mark 50. In some embodiments, the alignment mark 50 may be disposed between the center C1 of the first electronic structure 10 and the first electric contact 20 (e.g., the inner electric contacts 22).

In some embodiments, a pitch between the first electric contact 20 and the alignment mark 50 may be less than a pitch between two adjacent first electric contacts 20.

As shown in FIG. 22, a position of the alignment mark 50 may be lower than a position of the first electric contacts 20. For example, the alignment mark 50 may be embedded in the redistribution structure 12 of the first electronic structure 10. In some embodiments, the alignment mark 50 may be embedded in the dielectric layer 121 and disposed adjacent to the circuit layer 122. In some embodiments, the alignment mark 50 may be a portion of the circuit layer 122. Further, a size of the alignment mark 50 may be less than a size of the first electric contact 20.

Figure 23:
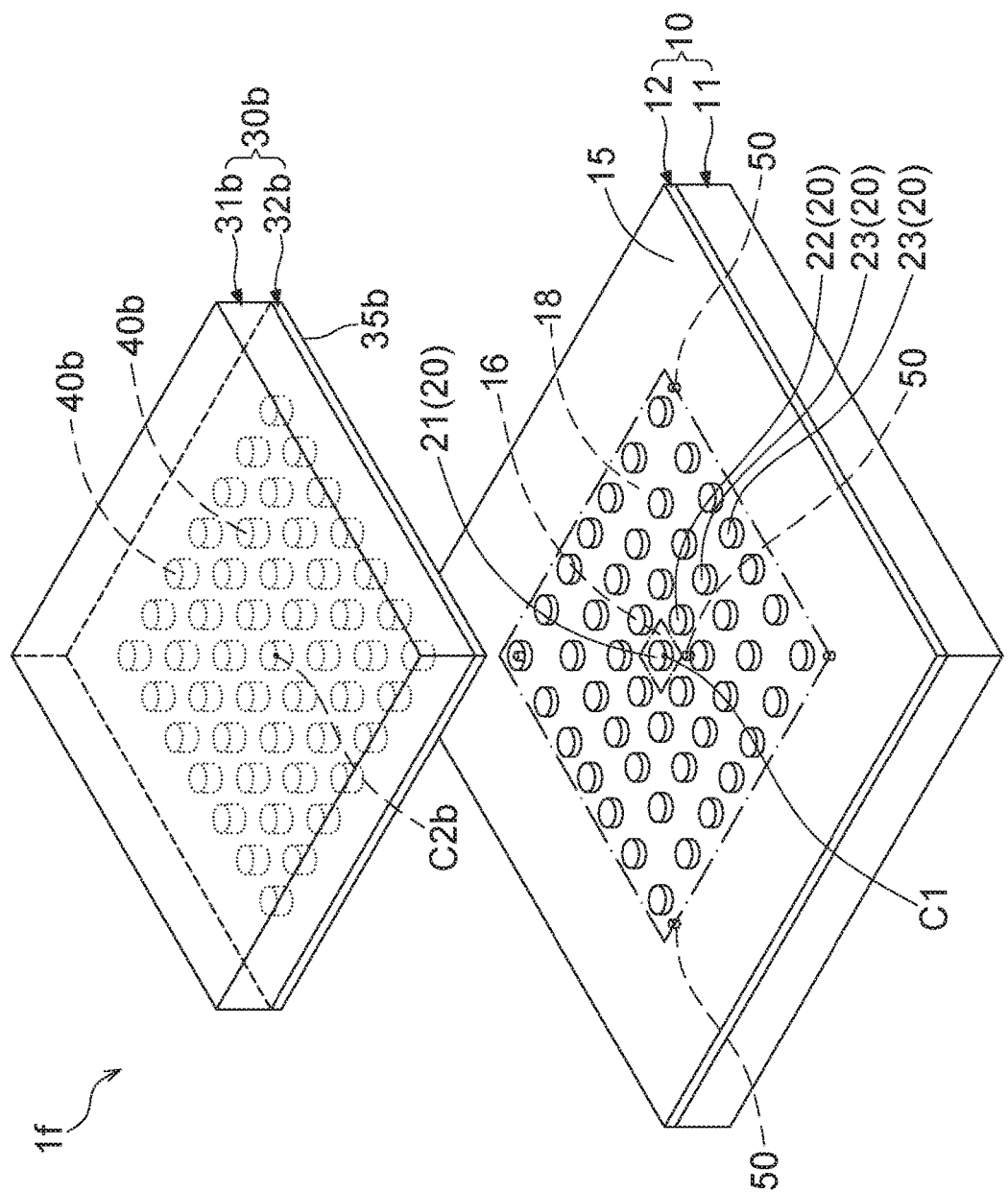
FIG. 23 illustrates an exploded view of a device structure according to some embodiments of the present disclosure.
Figure 24:
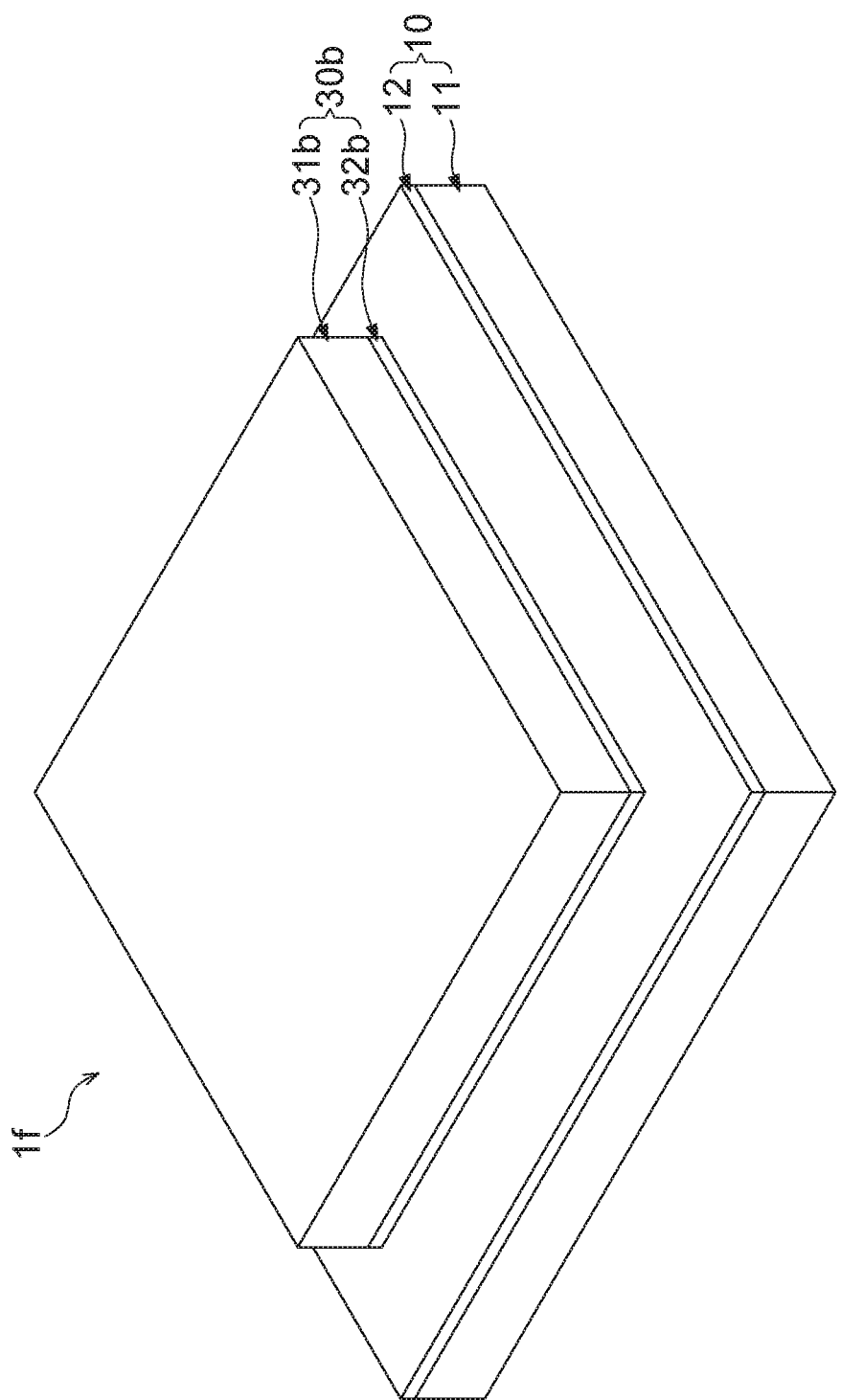
FIG. 24 illustrates an assembled view of FIG. 23.
Figure 25:
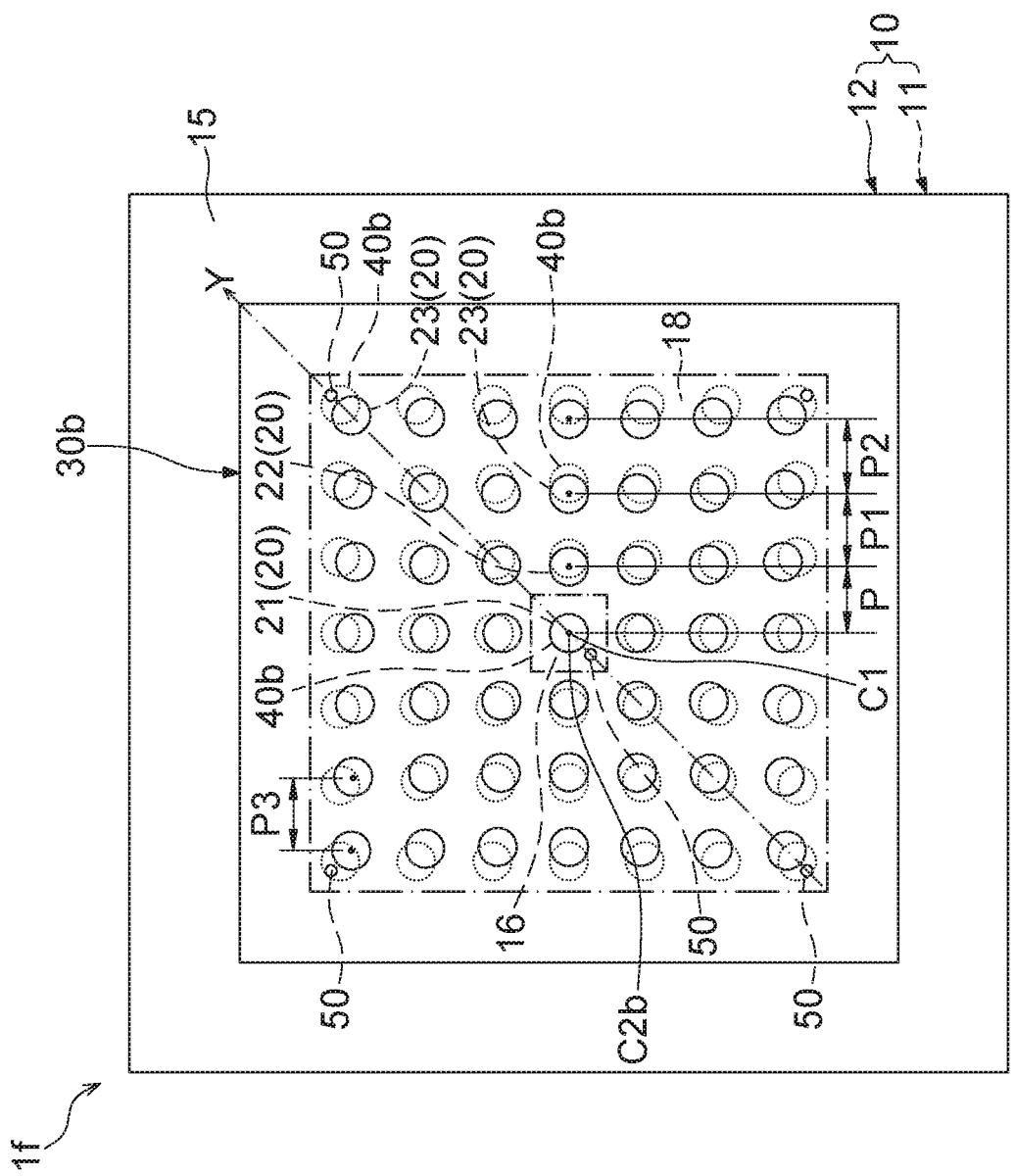
FIG. 25 illustrates a top view of FIG. 24.
Figure 26:
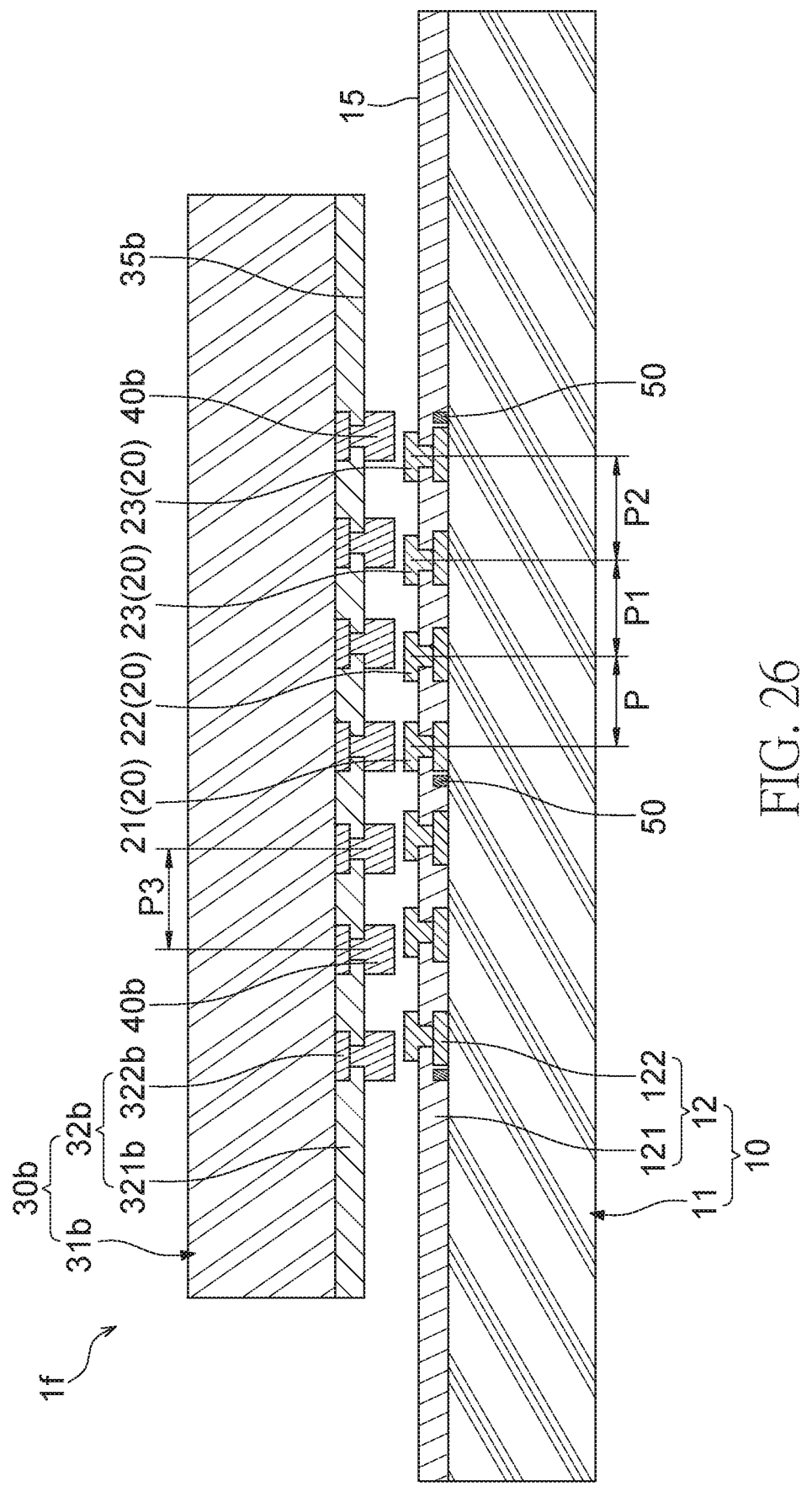
FIG. 26 illustrates a cross-sectional view of FIG. 24.

FIG. 23 illustrates an exploded view of a device structure 1f according to some embodiments of the present disclosure. FIG. 24 illustrates an assembled view of FIG. 23. FIG. 25 illustrates a top view of FIG. 24. FIG. 26 illustrates a cross-sectional view of FIG. 24. Referring to FIG. 23 through FIG. 26, the device structure 1f is similar to the device structure 1e shown in FIG. 20 through FIG. 22, except that the device structure 1f further includes a second electronic structure 30b and a plurality of second electric contacts 40b.

The second electronic structure 30b may be, for example, a substrate or a semiconductor die. The second electronic structure 30b corresponds to the first electronic structure 10. The second electronic structure 30b has a surface 35b (e.g., a bottom surface) and a center C2b. The surface 35b faces the first electronic structure 10. The center C2b corresponds to the center C1 of the first electronic structure 10.

As shown in FIG. 23 and FIG. 26, the second electronic structure 30b may include a base 31b and a circuit structure 32b. A material of the base 31b may be, for example, organic material or inorganic material. The circuit structure 32b may be disposed on the base 31b (e.g., a bottom surface of the base 31b). The surface 35b may be a bottom surface of the circuit structure 32b. In some embodiments, the circuit structure 32b may include at least one passivation layer 321b and at least one circuit layer 322b. The circuit layer 322b is embedded in the passivation layer 321b.

As shown in FIG. 25 and FIG. 26, the second electric contacts 40b correspond to the first electric contacts 20. The second electric contacts 40b are disposed on and electrically connected to the circuit structure 32b of the second electronic structure 30b. In some embodiments, the second electric contacts 40b may extend through the passivation layer 321b and be electrically connected to the circuit layer 322b of the circuit structure 32b. Further, the second electric contacts 40b are exposed from the surface 35b (e.g., the bottom surface of the circuit structure 32b) of the second electronic structure 30b.

In some embodiments, the alignment mark 50 may correspond to a portion of at least one of the second electric contacts 40b to improve the alignment between the first electric contacts 20 and the second electric contacts 40b. Further, a size of the alignment mark 50 may be less than a size of each of the second electric contacts 40b.

Before the solder reflow process, the second electric contacts 40b may be aligned with the first electric contacts 20 through the alignment mark 50. For example, the alignment mark 50 adjacent to the most peripheral outer electric contact 23 may correspond to a portion of the most peripheral second electric contact 40b to achieve the alignment between the second electric contacts 40b and the first electric contacts 20 (including, for example, the central electric contact 21, the inner electric contacts 22 and the outer electric contacts 23).

In some embodiments, the first electronic structure 10 may be a substrate, thus, the first electric contacts 20 may be metal pads. The second electronic structure 3b may be a semiconductor die, thus, the second electric contacts 40b may be metal bumps.

Figure 27:
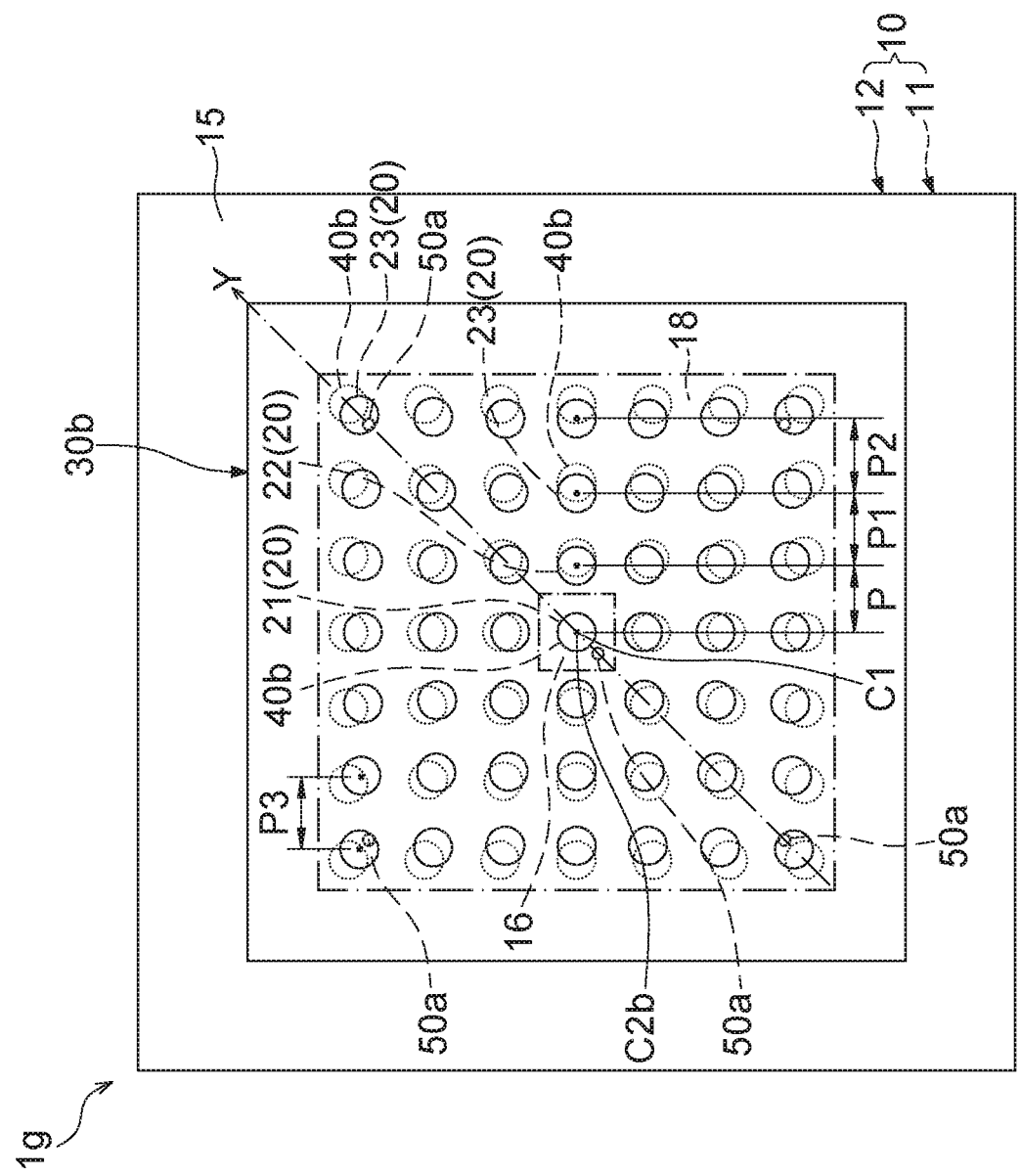
FIG. 27 illustrates a top view of a device structure according to some embodiments of the present disclosure.
Figure 28:
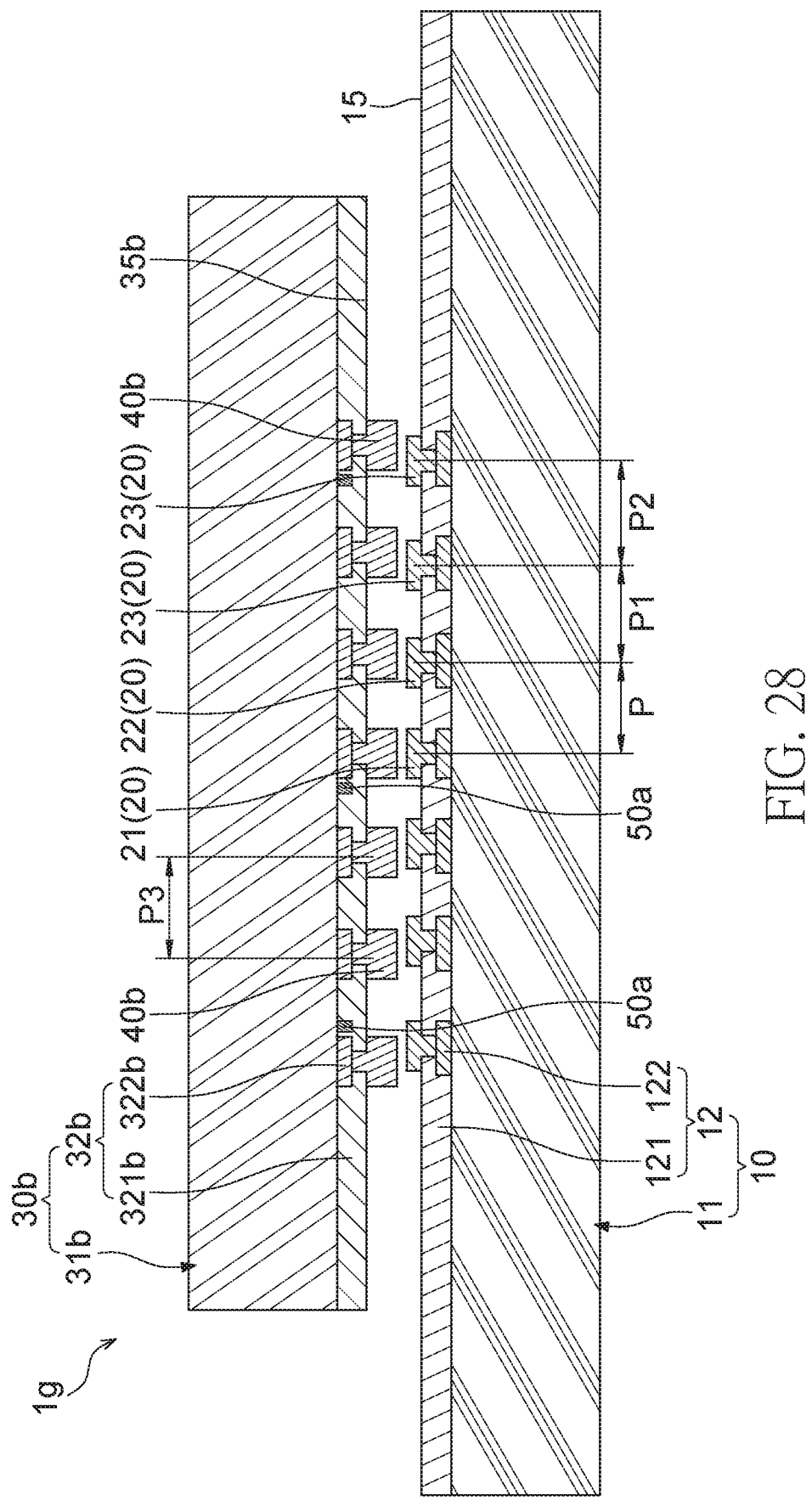
FIG. 28 illustrates a cross-sectional view of FIG. 27.

FIG. 27 illustrates a top view of a device structure 1g according to some embodiments of the present disclosure. FIG. 28 illustrates a cross-sectional view of FIG. 27. Referring to FIG. 27 through FIG. 28, the device structure 1g is similar to the device structure if shown in FIG. 23 through FIG. 26, except for the configuration of the alignment mark 50a. In some embodiments, the alignment mark 50a may be disposed adjacent to at least one of the second electric contacts 40b.

The alignment mark 50a may be embedded in the circuit structure 32b of the second electronic structure 30b. In some embodiments, the alignment mark 50a may be embedded in the passivation layer 321b and disposed adjacent to the circuit layer 322b. Further, the alignment mark 50a may correspond to a portion of at least one of the first electric contacts 20 (e.g., the outer electric contact 23) to improve the alignment between the first electric contacts 20 and the second electric contacts 40b.

Figure 29:
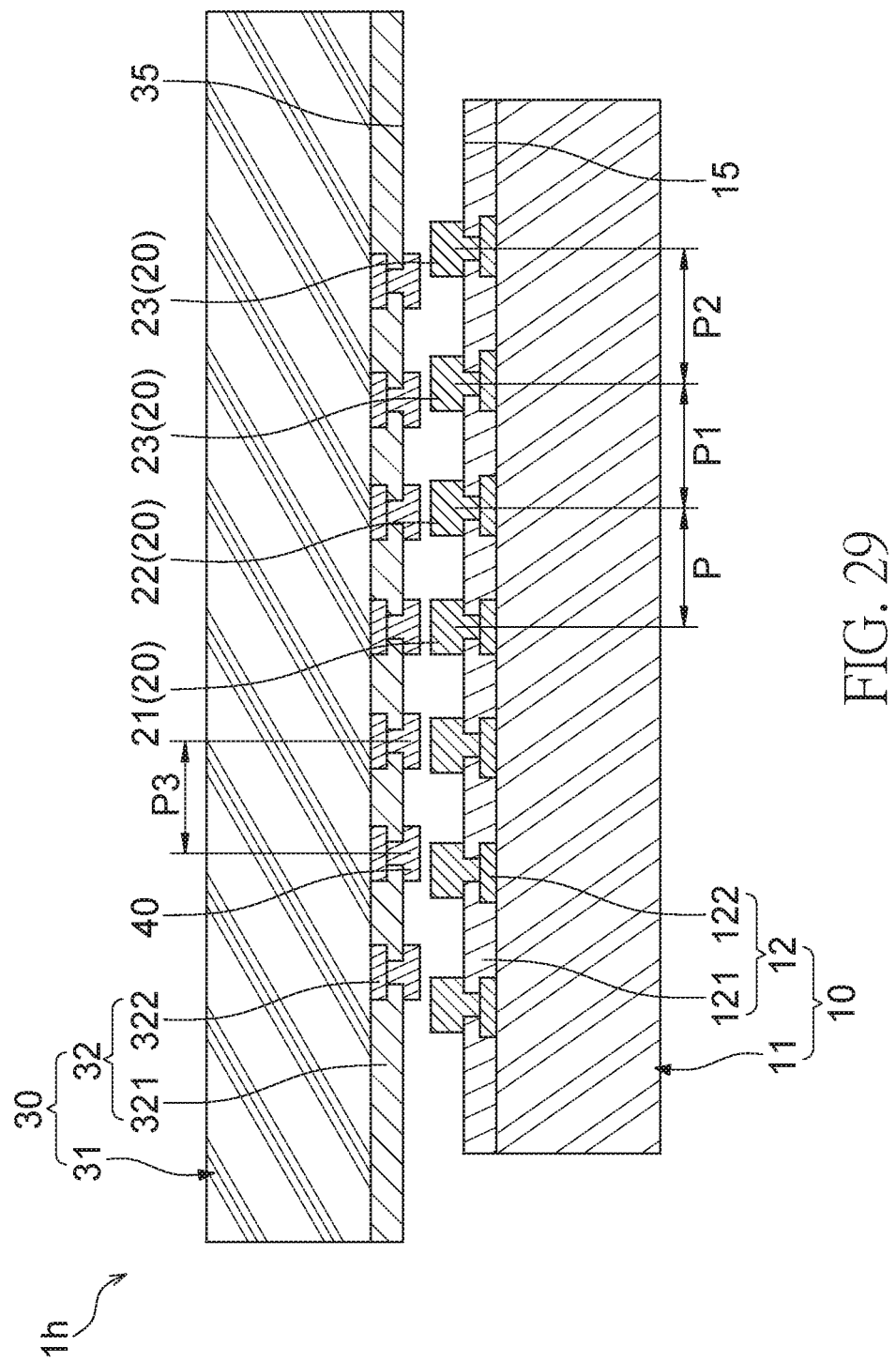
FIG. 29 illustrates a cross-sectional view of a device structure according to some embodiments of the present disclosure.

FIG. 29 illustrates a cross-sectional view of a device structure 1h according to some embodiments of the present disclosure. The device structure 1h is similar to the device structure 1b shown in FIG. 5 through FIG. 8, except for the configurations of the first electronic structure 10, the first electric contacts 20, the second electronic structure 30 and the second electric contacts 40. In some embodiments, the first electronic structure 10 may be a semiconductor die, thus, the first electric contacts 20 may be metal bumps. The second electronic structure 30 may be a substrate, thus, the second electric contacts 40 may be metal pads. That is, the CTE of the second electronic structure 30 may be greater than the CTE of the first electronic structure 10, and the second electric contacts 40 (e.g., metal pads) may generate an outward displacement relative to the corresponding first electric contacts 20 (e.g., metal bumps) due to thermal expansion in the solder reflow process. However, the designed pitch (including, for example, the pitch P, the pitch P1 and the pitch P2) between the first electric contacts 20 (including, for example, the central electric contact 21, the inner electric contacts 22 and the outer electric contacts 23) may compensate positional deviations of the second electric contacts 40 caused by the outward displacement of the second electric contacts 40, thereby preventing the second electric contacts 40 from misalignment with the first electric contacts 20 in the solder reflow process.

Figure 30:
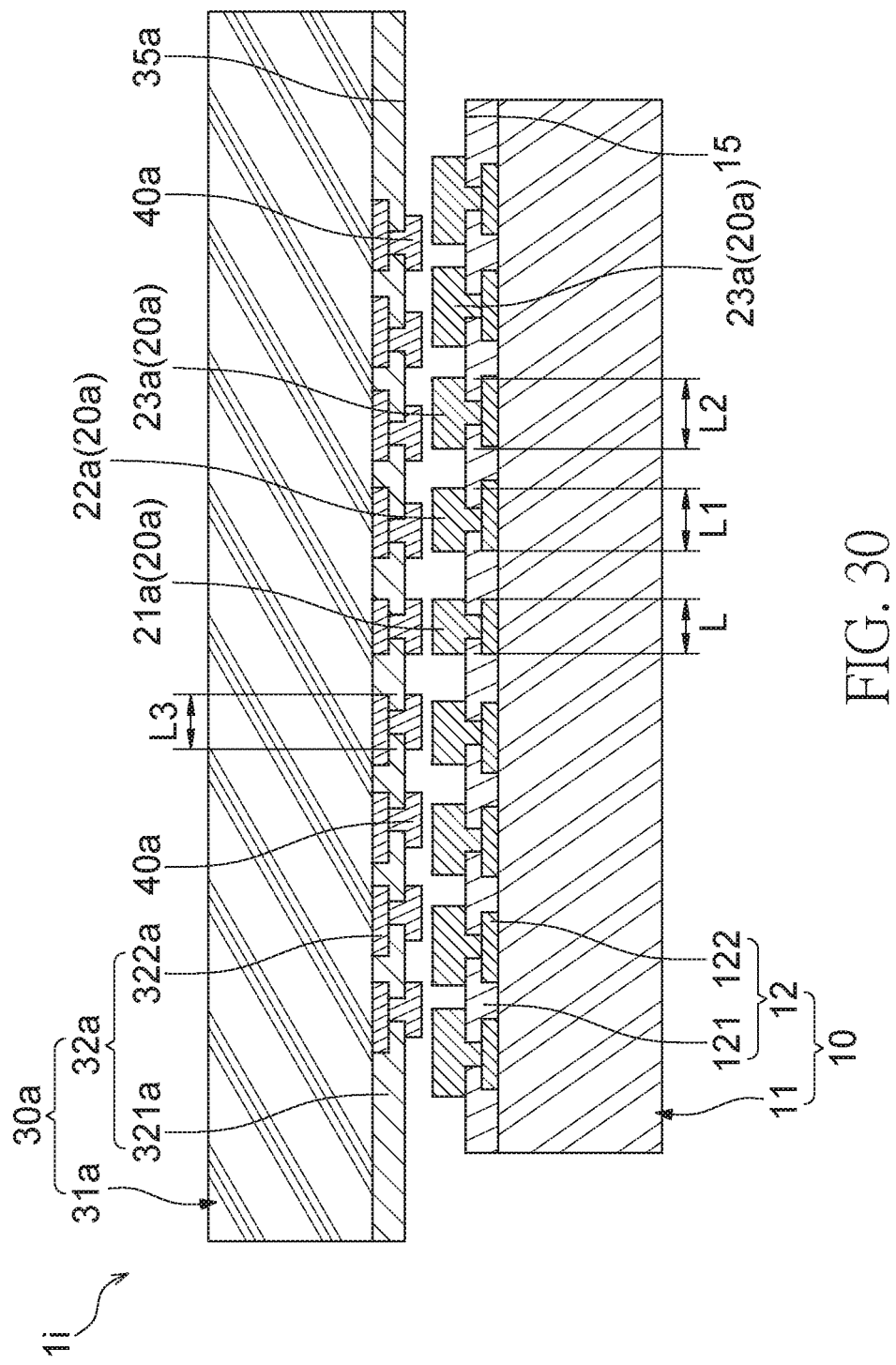
FIG. 30 illustrates a cross-sectional view of a device structure according to some embodiments of the present disclosure.

FIG. 30 illustrates a cross-sectional view of a device structure 1i according to some embodiments of the present disclosure. The device structure 1i is similar to the device structure 1d shown in FIG. 14 through FIG. 17, except for the configurations of the first electronic structure 10, the first electric contacts 20a, the second electronic structure 30a and the second electric contacts 40a. In some embodiments, the first electronic structure 10 may be a semiconductor die, thus, the first electric contacts 20a may be metal bumps. The second electronic structure 30a may be a substrate, thus, the second electric contacts 40a may be metal pads. That is, the CTE of the second electronic structure 30a may be greater than the CTE of the first electronic structure 10, and the second electric contacts 40a (e.g., metal pads) may generate an outward displacement relative to the corresponding first electric contacts 20a (e.g., metal bumps) due to thermal expansion in the solder reflow process. However, the designed maximum length (including, for example, the maximum length L, the maximum length L1 and the maximum length L2) of each of the first electric contacts 20a (including, for example, the central electric contact 21a, the inner electric contacts 22a and the outer electric contacts 23a) may compensate positional deviations of the second electric contacts 40a caused by the outward displacement of the second electric contacts 40a, thereby preventing the second electric contacts 40a from misalignment with the first electric contacts 20a in the solder reflow process.

Figure 31:
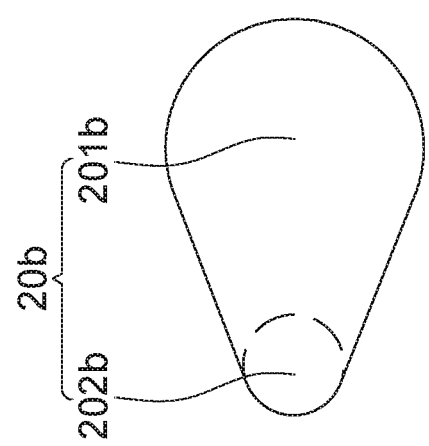
FIG. 31 illustrates a schematic view of a first electric contact according to some embodiments of the present disclosure.

FIG. 31 illustrates a schematic view of a first electric contact 20b according to some embodiments of the present disclosure. The first electric contact 20b of FIG. 31 includes a contact portion 201b and an alignment portion 202b connected to the contact portion 201b. In some embodiments, a size of the alignment portion 202b may be less than a size of the contact portion 201b.

Figure 32:
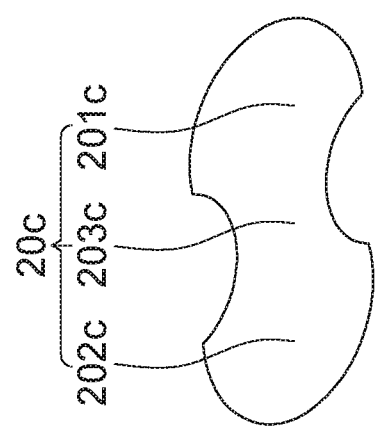
FIG. 32 illustrates a schematic view of a first electric contact according to some embodiments of the present disclosure.

FIG. 32 illustrates a schematic view of a first electric contact 20c according to some embodiments of the present disclosure. The first electric contact 20c of FIG. 32 includes a first contact portion 201c, a second contact portion 202c opposite to the first contact portion 201c and an intermediate contact portion 203c between the first contact portion 201c and the second contact portion 202c. The intermediate contact portion 203c may be connected to the first contact portion 201c and the second contact portion 202c. In some embodiments, a shape of the first contact portion 201c may be the same or similar to a shape of the second contact portion 202c.

Figure 33:
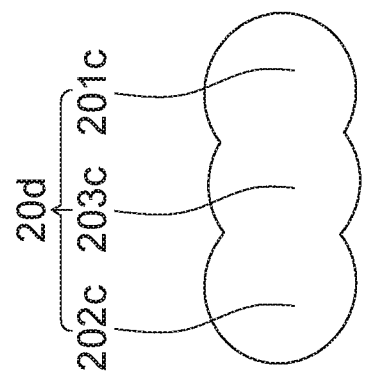
FIG. 33 illustrates a schematic view of a first electric contact according to some embodiments of the present disclosure.

FIG. 33 illustrates a schematic view of a first electric contact 20d according to some embodiments of the present disclosure. The first electric contact 20d of FIG. 33 is similar to the first electric contact 20c of FIG. 32, except that the shapes of the first contact portion 201c, the second contact portion 202c and the intermediate contact portion 203c.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A device structure, comprising:
   a first electronic structure having a surface and a center; and
   a plurality of first electric contacts exposed from the surface, wherein each of the first electric contacts has a maximum length along a long axis thereof, the long axis extends through the center, and the maximum length increases with increasing distance from the center,
   wherein the first electric contact includes a contact portion and an alignment portion connected to the contact portion, a size of the alignment portion is less than a size of the contact portion.

2. The device structure of claim 1, wherein the first electronic structure further has a central area and a peripheral area on the surface, the center is within the central area, the peripheral area surrounds the central area, the first electric contacts include at least one central electric contact disposed in the central area, a plurality of inner electric contacts disposed in the peripheral area and adjacent to the central area and a plurality of outer electric contacts disposed in the peripheral area and far away the central area, and a maximum length of each of the inner electric contacts is greater than a maximum length of the central electric contact.

3. The device structure of claim 2, wherein a maximum length of each of the outer electric contacts is greater than the maximum length of each of the inner electric contacts.

4. The device structure of claim 2, further comprising a second electronic structure corresponding to the first electronic structure and a plurality of second electric contacts corresponding to the first electric contacts, wherein the second electronic structure has a surface facing the first electronic structure and a center corresponding to the center of the first electronic structure, and the second electric contacts are exposed from the surface.

5. The device structure of claim 4, wherein the maximum length of each of the inner electric contacts is greater than a maximum length of each of the second electric contacts.

6. The device structure of claim 4, wherein a maximum length of each of the outer electric contacts is greater than a maximum length of each of the second electric contacts.

7. The device structure of claim 4, wherein the first electronic structure is a substrate, the first electric contacts are metal pads, the second electronic structure is a semiconductor die, and the second electric contacts are metal bumps.

8. The device structure of claim 4, wherein the first electronic structure is a semiconductor die, the first electric contacts are metal bumps, the second electronic structure is a substrate, and the second electric contacts are metal pads.

9. The device structure of claim 4, further comprising:
   at least one alignment mark disposed adjacent to at least one of the first electric contacts, wherein the alignment mark is disposed at an axis extending through the center of the first electronic structure.

10. The device structure of claim 9, wherein the first electric contact is disposed between the center of the first electronic structure and the alignment mark.

11. The device structure of claim 9, wherein the alignment mark is disposed between the center of the first electronic structure and the first electric contact.

12. The device structure of claim 9, further comprising a second electronic structure corresponding to the first electronic structure and a plurality of second electric contacts corresponding to the first electric contacts, wherein the first electronic structure is a substrate, the first electric contacts are metal pads, the second electronic structure is a semiconductor die, and the second electric contacts are metal bumps.

13. The device structure of claim 9, further comprising a second electronic structure corresponding to the first electronic structure and a plurality of second electric contacts corresponding to the first electric contacts, wherein the first electronic structure is a semiconductor die, the first electric contacts are metal bumps, the second electronic structure is a substrate, and the second electric contacts are metal pads.

14. The device structure of claim 9, wherein a position of the alignment mark is lower than a position of the first electric contacts.

15. The device structure of claim 9, wherein a size of the alignment mark is less than a size of the first electric contact.

16. The device structure of claim 9, wherein a pitch between the first electric contact and the alignment mark is less than a pitch between the first electric contact and an adjacent first electric contact.

17. The device structure of claim 13, wherein the alignment mark corresponds to a portion of at least one of the second electric contacts.

18. The device structure of claim 1, wherein the first electronic structure includes a base and a redistribution structure disposed on the base, the surface is a top surface of the redistribution structure, and the first electric contacts are disposed on and electrically connected to the redistribution structure.

19. The device structure of claim 1, wherein the first electric contact includes a first contact portion, a second contact portion opposite to the first contact portion and an intermediate contact portion between the first contact portion and the second contact portion, wherein the intermediate contact portion is connected to the first contact portion and the second contact portion.

* * * * *